United States Patent [19]

Sutton et al.

[11] Patent Number: 4,677,620
[45] Date of Patent: Jun. 30, 1987

[54] GRAPHICAL INPUT OF TIMING RELATIONSHIPS

[75] Inventors: Steven R. Sutton, Beaverton; Gerd H. Hoeren, Lake Oswego, both of Oreg.

[73] Assignee: Tektronix, Inc., Beaverton, Oreg.

[21] Appl. No.: 706,578

[22] Filed: Feb. 28, 1985

[51] Int. Cl.[4] .................. G06F 11/00; G01R 17/00
[52] U.S. Cl. ........................... 371/27; 364/189; 324/73 R; 340/814
[58] Field of Search .................. 371/1, 27; 364/188, 364/189, 190, 900, 431.11, 431.08, 431.07; 360/26; 73/117.3; 123/416, 417; 324/379, 386, 391, 392; 340/709, 814

[56] References Cited

U.S. PATENT DOCUMENTS

| | | | |
|---|---|---|---|
| 3,728,679 | 4/1973 | McIntosh | 371/1 |
| 4,024,498 | 5/1977 | McIntosh | 371/1 |
| 4,139,147 | 2/1979 | Franke | 371/1 X |
| 4,331,029 | 5/1982 | Wilson | 73/117.3 |
| 4,488,297 | 12/1984 | Vaid | 371/1 |
| 4,490,821 | 12/1984 | Lacher | 371/1 |

Primary Examiner—Jerry Smith
Assistant Examiner—Robert W. Beausoliel, Jr.
Attorney, Agent, or Firm—John P. Dellett; Francis I. Gray

[57] ABSTRACT

A method for adjusting a time delay of a signal with respect to a reference event is achieved by displaying a graphical representation of the delay time on a display terminal, modifying the displayed graphical depiction to indicate a different time delay, and then adjusting the time delay of the signal to match the modified time delay indicated by the displayed graphical depiction. The display terminal is controlled by a display controller and the graphical depiction of the delay time is modified by an operator using cursor control keys of a keyboard to transmit a first indicating signal to the display controller and other keys of the keyboard to transmit a second indicating signal to the display controller. Each time the controller detects a first indicating signal, the graphically displayed delay time is incremented and each time the controller detects a second indicating signal, the graphically displayed delay time is decremented. The controller automatically adjusts the actual test signal delay time after the displayed delay time has been adjusted.

9 Claims, 5 Drawing Figures

GRAPHICAL INPUT OF TIMING RELATIONSHIPS

BACKGROUND OF THE INVENTION

The present invention relates in general to digital logic test equipment and more particularly to a method and apparatus for inputting data for adjustment of test signal timing relationships.

To test a digital circuit it is often useful to apply several digital test signals to a number of points in the circuit, each test signal changing state in a specified sequence and at a specified time with respect to a reference clock cycle. In the prior art, signal pattern generators capable of providing these timed test signal patterns were preprogrammed to provide the proper signal patterns and timing by an operator inputting numerical pattern and timing data. Usually digital circuit manufacturers provide test signal timing data graphically in the form of timing diagrams. Therefore, prior to programming a signal pattern generator to reproduce the test signals, an operator must first convert the graphical timing data of the timing diagrams into numerical timing data and then input that numerical data into the pattern generator. This conversion process takes time and is subject to error.

SUMMARY OF THE INVENTION

According to one aspect of the invention, a timing chart depicting the timing relations of a number of test signals to be generated by a signal pattern generator is displayed on a cathode ray tube (CRT) controlled by a microprocessor. Using a keyboard input to the microprocessor, an operator may then rearrange the displayed timing chart to match test signal timing charts published by manufacturers of equipment to be tested. When the displayed timing chart is appropriately adjusted, the microprocessor programs the signal pattern generator to generate test signals timed according to the information displayed by the timing chart.

According to another aspect of the invention, the operator modifies the timing of each signal on the chart by selectively pressing increment and decrement keys on the keyboard which causes the timing of the signal relative to a reference cycle to be advanced or retarded. Thus an operator is able to input test signal timing data to a signal pattern generator by reproducing a manufacturer's test signal timing chart for a device to be tested without requiring him to first convert the graphically represented data of a timing chart into its numerical equivalents.

It is accordingly an object of the invention to provide a new and improved method and apparatus for inputting test signal timing relationship data used to program the operation of a signal pattern generator.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a block diagram of a signal pattern generator for use in conjunction with the present invention, FIG. 2 is a block diagram of a probe pod of FIG. 1, FIG. 3 is an example of a menu and timing chart according to the present invention as may be displayed on the display terminal of FIG. 1, and FIG. 4A and FIG. 4B are a flow chart of a software program for the microprocessor of FIG. 1 which permits timing data input to the signal pattern generator according to the present invention.

DETAILED DESCRIPTION

Figure 1:
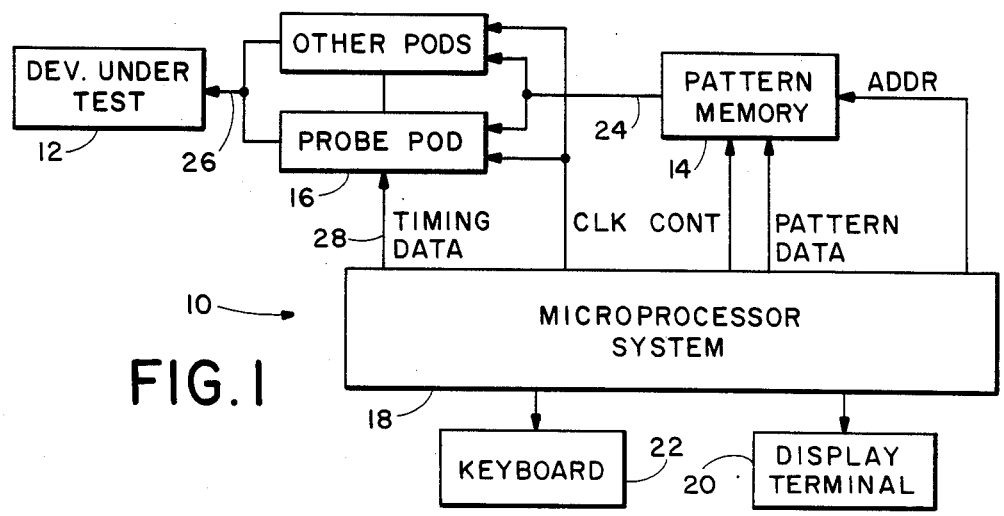

Referring to FIG. 1, a signal pattern generator 10, depicted in block diagrlam form, is adapted to generate a set of digital test signals to be applied to device under test 12. The digital test signals change state in specified sequences with each state change of each test signal occurring at a specified time during a reference clock cycle.

Signal pattern generator 10 has a pattern memory 14, a set of probe pods 16, a microprocessor system 18, a display terminal 20 and a keyboard 22. The random access pattern memory 14 stores data words with each bit of each word controlling the state of a digital test signal to be applied to device under test 12. The data words are written into pattern memory 14 by microprocessor system 18 which controls pattern memory 14 read and write operations through data, address and control lines connected thereto. In the preferred embodiment microprocessor system 18 incorporates an Intel 8088 microprocessor and includes an operating system capable of running a Pascal language program such as that in Appendix I to this specification. By appropriately addressing pattern memory 14 during a series of memory read cycles, microprocessor system 18 can cause pattern memory 14 to generate any desired sequence of stored data words as output to probe pods 16 over data output bus 24.

Probe rods 16 transmit test signals to device under test 12 over parallel test lines (channels) 26, the signal state of each channel changing in response to a change in state of a separate bit of the data received by probe pods 16 from the pattern memory 14. Probe pods 16 include programmable delay circuits, one per channel, such that a change in state of any channel line 26 in response to a change in state of a corresponding bit of the data from pattern memory 14 may be delayed by an adjustable amount. The amount of delay for each channel is controlled by timing data generated by microprocessor 18 and applied to each probe pod 16 over data lines 28.

Figure 2:
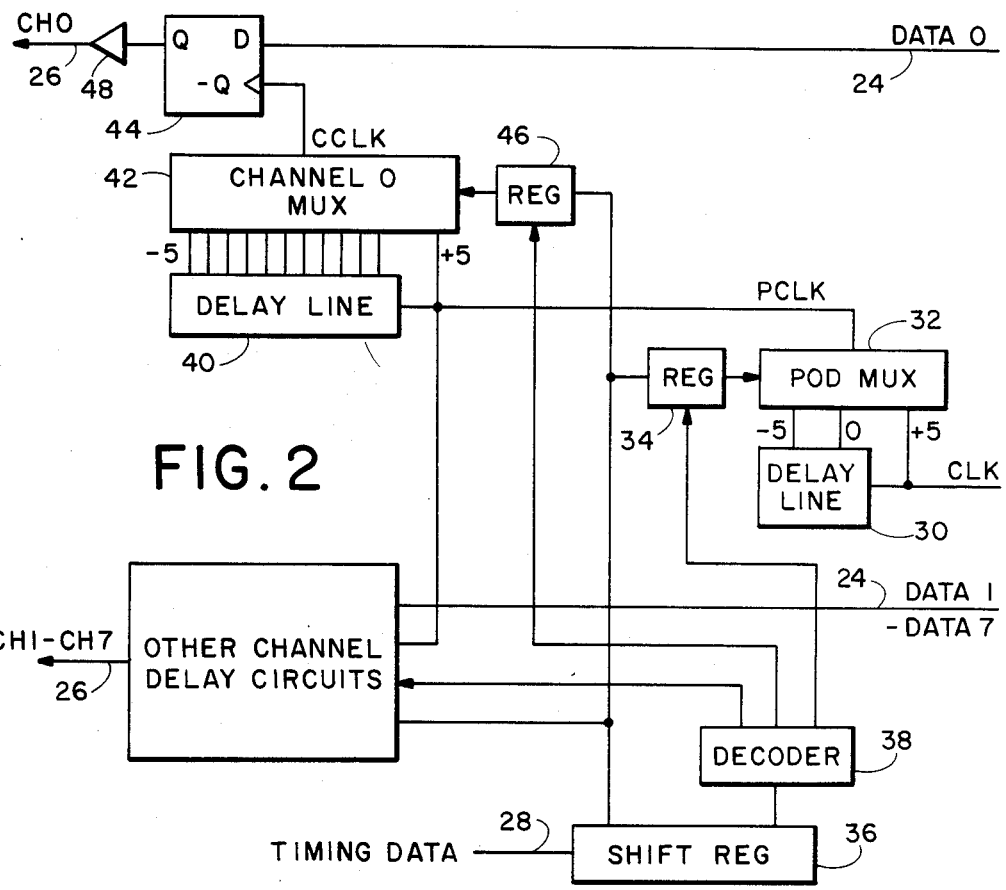

FIG. 2 is a block diagram of an embodiment of one probe pod 16 of FIG. 1. Each probe pod comprises a pod clock delay circuit including a two step tapped delay line 30 having a five nS delay for each step. The two taps from delay line 30 and the CLK signal are applied to three inputs of a multiplexer 32. The multiplexer 32 selectively couples one of its inputs to its output such that its output, designated the "pod clock" PCLK, changes state either five nS before ($-5$), at the same time (0), or five nS after ($+5$) an arbitrary reference point in the system clock. The switching state of multiplexer 32 is controlled by two data bits stored in register 34. Register 34 is previously loaded by serial data transmitted from microprocessor system 18 over timing data line 28 to shift register 36. The low order bits of the timing data include the appropriate data to be stored in a register of the pod while the high order bits of the timing data comprise the address of the register to receive the data. The high order bits are applied to decoder 38 which energizes an output line connected to a write control input of register 34, if the register is being addressed, thereby causing the register to store the low order bit data.

The PCLK output of pod multiplexer 32 is applied in common to eight channel timing circuits. Only the channel 0 timing circuit, comprising delay line 40, multiplexer 42, flip-flop 44, register 46, and buffer 48, is shown in detail in FIG. 2, the other channel timing circuits being similar in detail to the channel 0 timing circuit. The PCLK signal is applied to the input of a ten step tapped delay line 40 with each step delaying the PCLK signal 1 nS. The ten taps of the delay line, along with the PCLK signal, are applied to inputs of a channel 0 multiplexer 42. The eleven multiplexer 42 inputs are designated as −5 to +5 nS in steps of 1 nS in reference to some arbitrary point in the PCLK signal. A channel clock CCLK output of multiplexer 42 is applied to a clock input of D-type flip-flop 44. The switching state of the channel 0 multiplexer 42 is determined by data stored in register 46, also loaded in the same fashion as register 34 by timing data transmitted from the microprocessor system 18 through shift register 36. Register 46 is also input enabled by a signal from decoder 38.

One line, DATA 0, of a set of eight data lines 24 from pattern memory 14 to the pod 16 is applied to the D input of flip-flop 44 such that the state of a Q output of flip-flop 44 changes to match the state of the DATA 0 line whenever the flip-flop 44 clock input is strobed by a signal from the channel 0 multiplexer 42. The Q output, applied through buffer 48 to the device under test 12, has one test signal CH0 of test lines 26 applied to device under test 12. Assuming the system timing cycle reference point occurs 10 nS after the system clock CLK changes state, the state of CH0 can change at the system reference point if multiplexer 32 is set such that PCLK changes state 5 nS after CLK changes state (i.e. the 0 tap of delay lind 30 is selected) while multiplexer 42 is set such that the CCLK signal changes state 5 nS after PCLK changes state (i.e. the 0 tap of delay line 40 is selected). The relative timing of the CH0 state changes, with respect to the system reference timing point, can be adjusted from −10 to +10 nS by appropriately setting the switching positions of the pod and channel multiplexers 32 and 42. For instance a −10 nS setting, indicating that the CCLK changes state 10 nS before the system reference point, is obtained by setting pod multiplexer 32 such that PCLK is advanced by 5 nS (i.e., by selecting the −5 input) and setting the channel multiplexer 42 such that the CCLK signal is also advanced by 5 nS (i.e., the −5 input).

Figure 3:
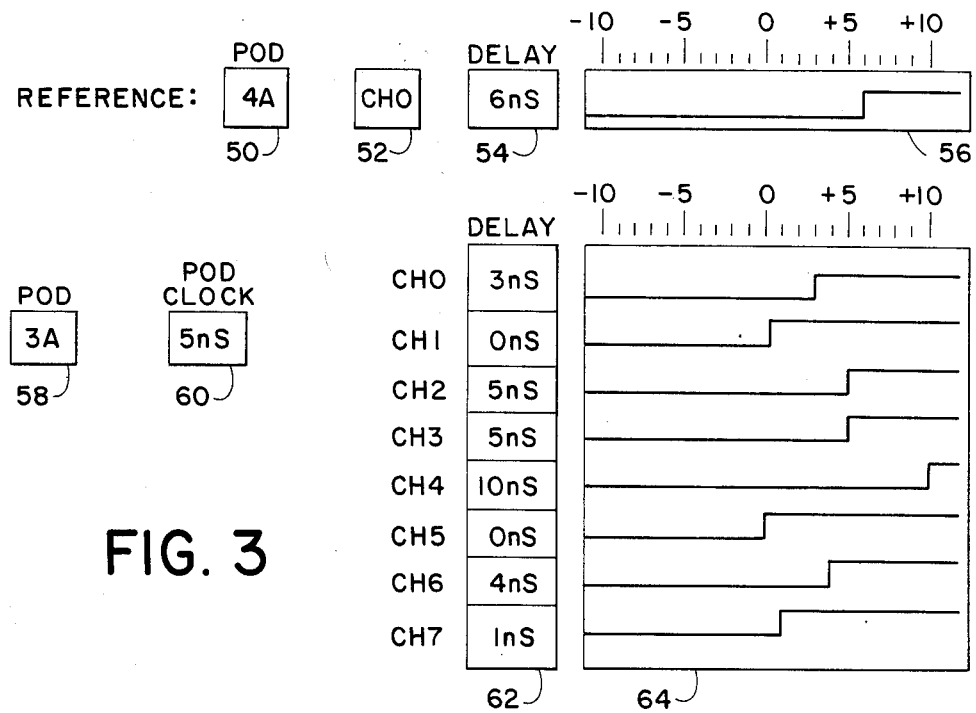

FIG. 3 depicts a menu to be displayed on display terminal 20 of FIG. 1 when an operator wishes to alter the relative timing of one or more of the test signal channel outputs. The display shows in field 50 a reference pod number, and in this case probe pod 4A has been selected. In field 52 one channel of the reference pod is selected as a reference channel. In this case channel 0 of pod 4A is selected. In field 54 the delay time of the reference channel, the sum of the associated pod multiplexer 32 and channel multiplexer 42 delay taap selections, ranging from −10 to +10 nS, is displayed. In this case the pod 4A multiplexer 32 has selected its +5 nS tap input while the channel 0 multiplexer 42 of pod 4A has also selected its +1 nS tap input such that the net delay of channel 0 is 6 nS. Field 56 is a graphical display of the state change timing of the reference channel timing signal with respect to the system reference timing point. The relative position of the state change indication, from −10 to +10 nS, matches the delay time in field 54, 6 nS.

In field 58 a probe pod whose timing is to be modified, in this case pod 3A, is selected. In field 60 the pod clock PCLK timing, being the pod multiplexer 32 setting (−5, 0 or +5 nS) of the selected pod, is displayed. In field 62 the relative timing of each channel of the selected pod, including the sum of the associated pod and channel multiplexer tap selections of each channel, is displayed. In field 64 the same information is displayed graphically.

An operator can select any of fields 50, 52, 58, 60 or 62 by using a set of cursor control keys on keyboard 22 of FIG. 1 to locate a cursor (not shown) under the selected field. Once a field is selected, the data in the field may be modified by using various other keys on the keyboard 22. Initially an operator might select a reference pod by selecting field 50 and, using alphanumeric keys on the keyboard, type in the designation of the selected pod. Then he can select the reference channel by selecting field 52 and pressing a "channel select" key on the keyboard which causes the channel designation in field 52 to increment each time it is pressed, reverting to the 0 channel when the key is pressed while CH 7 appears. The displays in fields 54 and 56 are automatically updated to match the current delay time settings associated with the reference channel when a new reference channel is selected.

The operator may then change the relative timing of any channel by first using the cursor key to select field 58 and then using alphanumeric keys to type in the designation of a selected pod. The pod clock setting for the selected pod can be changed by using the cursor keys to select field 60 and then by repeatedly pressing an "increment" key or a "decrement" key on keyboard 22 to shift the pod clock setting to −5, 0 or +5 nS. The delay times shown in 62 and 64 automatically change to suit when the pod clock setting is altered. For instance, if the pod clock is initially set at −5 nS, and the channel multiplexer for channel 4 is initially set to +1 nS then the delay times in fields 62 and 64 will indicate −4 nS. If the pod clock time in field 60 is then changed to +5 nS, then the delay time associated with CH 4 displayed in fields 62 and 64 will change to indicate +6 nS. The delay times displayed in fields 62 and 64 for all other channels of the pod will also shift by +10 nS when the pod clock delay is shifted by +10 nS.

Finally, the operator may set the timing of each channel of the pod by using the cursor keys to select the appropriate one of fields 62 and then using the increment and decrement keys to change the delay time settings indicated in the field. The delay time display increases by 1 nS each time the increment key is pressed and decreases by 1 nS each time the decrement key is selected. The graphical representation in field 64 also changes at the same time to match the numeric indication in field 62. With the pod clock selected at −5 nS, the channel delay times for the pod can range from −10 to 0 nS in steps of 1 nS. With the pod clock selected at 0 nS, the channel delay times can range from −5 to +5 nS. And with the pod clock set at +5 nS, the channel delay times can range from 0 to +10 nS.

Whenever the delay time associated with the selected reference channel is changed, the delay times associated with all other channels of all pods change automatically by a like amount. Also by changing the selected reference channel, by modifying fields 50 or 52, the displayed delay times of all other channels will change by a like amount if the delay time of the new reference channel differs from the delay time of the previous reference channel. Use of a reference channel allows the operator to change the timing of all channels by the same amount by changing the timing of the reference channel.

Once the pattern memory 14 of FIG. 1 has been loaded with the appropriate pattern data and once the delay times of all channels are adjusted as desired, the operator can initiate signal generation by pressing a "start" key on the keyboard 22. The appropriate data for setting the multiplexers in each pod to match the displayed timing charts is then transmitted over line 28 to the data registers 34 and 46 in each pod. When each multiplexer has been properly set, the microprocessor begins a test operation, initiating a series of pattern memory read cycles causing pattern memory 14 to transmit a series of selected data words to the probe pods 16 which then transmit the time delayed test signals to device under test 12.

Figure 4A:
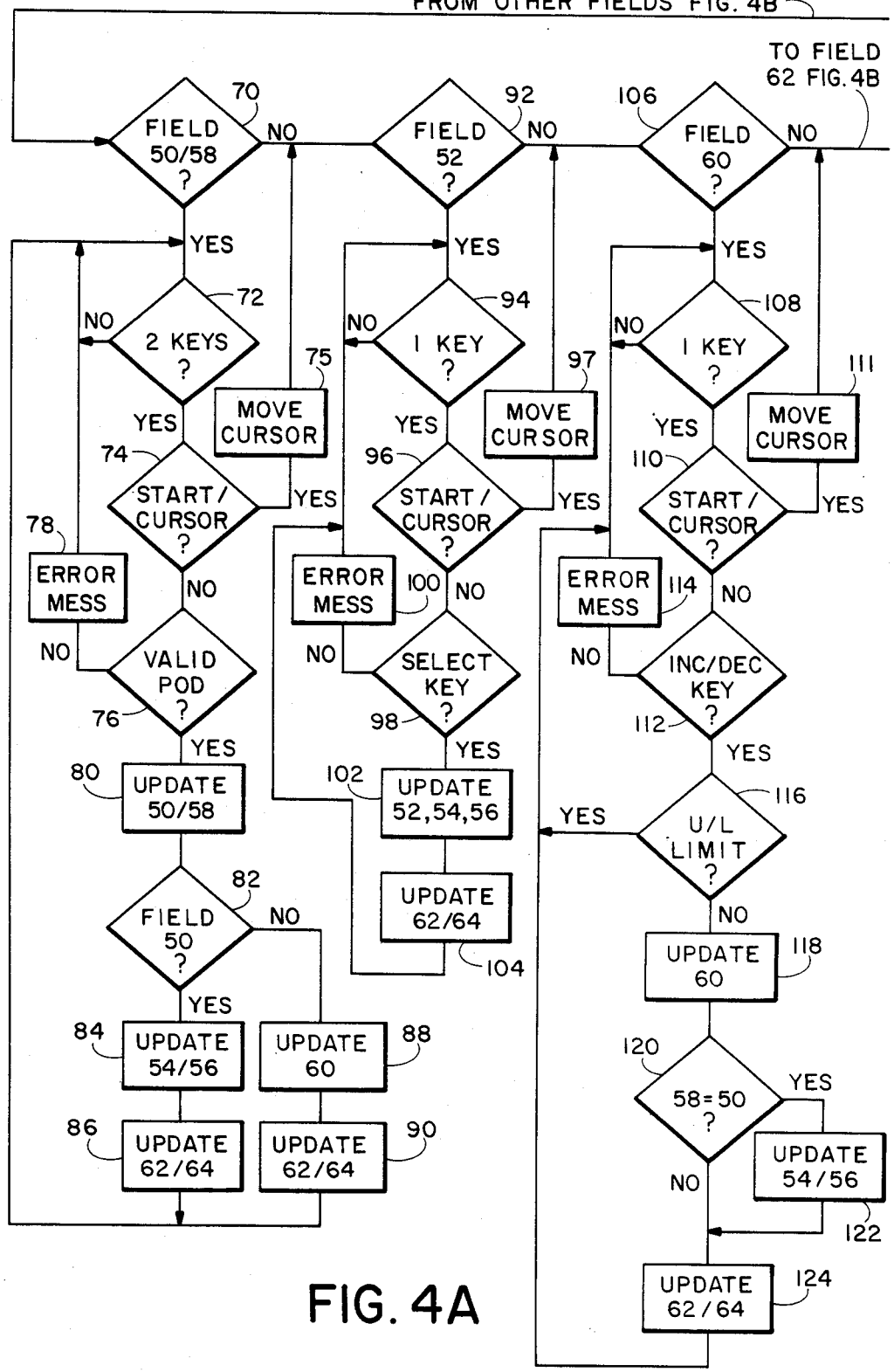
Figure 4B:
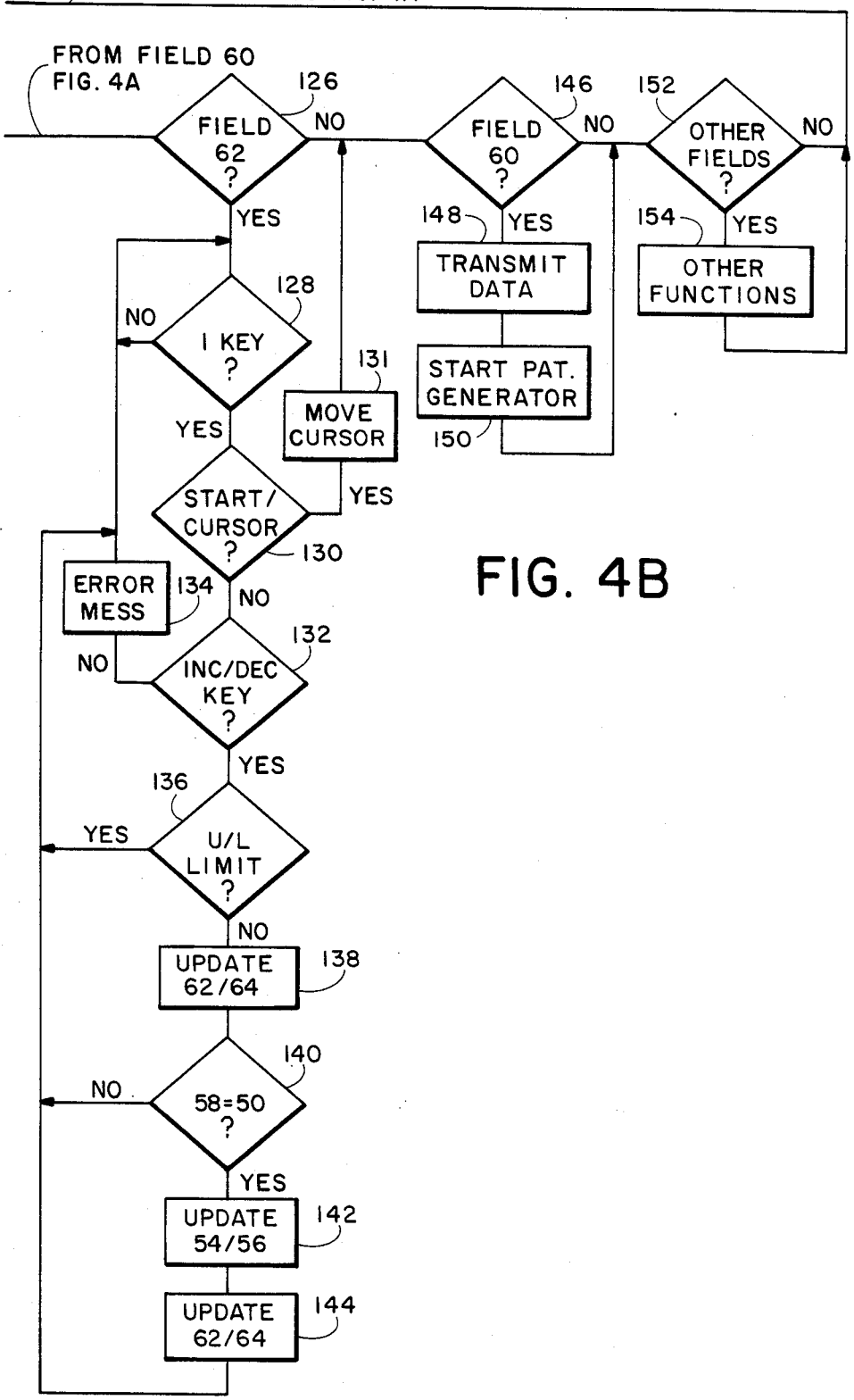

FIG. 4 is a flow chart for a software program for microprocessor system 18 controlling operator input of timing data. Once the menu of FIG. 3 is on the screen of display terminal 22, the cursor begins under field 50. If the cursor is currently under field 50, indicating the reference pod number, or under field 58, indicating a currently displayed pod number, block 70 of the flow chart directs program flow to block 72 where the program waits for 2 keys to be pressed. If two keys are pressed, program flow is directed to block 74 which determines if one of the keys pressed was either a cursor key or the start key. If a cursor control key or the start key was pressed, program flow is directed to block 75 where the cursor is relocated to the next field to the right, field 52, if the right move cursor control key was pressed, or to the next lower field, field 60, if the downward cursor key was pressed. Program flow is then directed to block 92.

If other than a cursor or the start key was pressed, block 74 directs program flow to block 76 where the new two digit data keyed in is checked to see if it indicates a valid pod number. If not, block 78 generates an error message and program flow is directed back to block 72. If the new pod number typed in is a valid pod number then program flow passes from block 76 to block 80 where the new number is displayed in field 50 or field 58, depending on the currently selected field. Program flow then passes to block 82. If field 50 is selected then block 82 directs program flow to block 84 where the display of fields 54 and 56 is updated and then to block 86 where the display of fields 62 and 64 is updated to account for the new reference channel. If field 58 is currently selected, program flow is directed by block 82 to block 88 where the pod clock display of field 60 is updated and then to block 90 where the display of fields 62 and 64 is updated to display the channel timing for the newly selected pod. From block 86 or block 90 program flow then passes back to block 72.

Once field 52 has been selected, and program flow reaches block 92, it is directed to block 94 where the program waits for a key to be pressed. When a keyboard key is pressed, program operation passes to block 96 which determines if a cursor key or the start key was selected. If so, block 96 directs the program to block 97 where the cursor is appropriately relocated on the screen if a cursor key was operated and then to block 106. If other than a cursor key or the start key was pressed, block 96 directs program flow to block 98 which determines if the select key was pressed. If not, flow is directed to block 100, which generates an error message, and then back to block 94 to wait for another key to be pressed. However if the select key was pressed, then program flow passes from block 98 to block 102 where the channel number is incremented in field 52 and the delay time displayed in fields 54 and 56 is updated to display the current delay time for the new reference channel. Program flow then passes to block 104 where the timing data and charts in fields 62 and 64 are modified to account for any difference between the delay times associated with the new and old reference channels. From block 104 program flow reverts back to block 94.

Once field 60 has been selected, and the program has reached block 106, block 108 is entered where the program again waits for a keyboard key to be pressed and then the program passes to block 110. If a cursor key or the start key is pressed then block 110 directs the program to block 111, where the cursor is appropriately relocated on the screen, and then on to block 126. If other than a cursor key was pressed, block 110 directs program flow to block 112 which in turn redirects flow to block 114 if other than an increment or decrement key was pressed. Block 114 generates an error message and then passes program operation back to block 108. If an increment or a decrement key was pressed, block 112 directs program operation to block 116. In block 116, the program checks to see if the current pod clock setting ($-5$, 0 or $+5$ nS) for the selected pod is already at its upper or lower limit. If the increment key was pressed with the pod clock setting already at $+5$ nS, or if the decrement key was pressed with the pod clock setting already at $-5$ nS, then the setting remains unchanged and the program returns to block 108 to wait for another key. Otherwise program flow is directed to block 118 where the pod clock delay time displayed in field 60 is increased or decreased by 5 nS according to whether the increment or decrement key was pressed. Then in block 120 the program determines whether the currently selected pod in field 58 is the same as the reference pod at field 50. If not, then block 124 is entered where the appropriate channel delay times in fields 62 and 64 are updated to account for the new pod clock setting. If the reference channel pod clock was changed, block 120 passes the program to block 122 where the displays in fields 54 and 56 are updated to reflect the new reference delay time. From block 122 program flow passes to block 124 where fields 62 and 64 are updated to change the delay times of all channels by an amount equal to the change in the reference channel. From block 124 the program returns to block 108.

Once field 62 has been selected, and program flow has reached block 126, it is directed to block 128 where the program again waits for a keyboard key to be pressed. When a key is pressed block 128 directs the program to block 130. If a cursor key or the start key is pressed then block 130 directs program operation to block 131 where the cursor is appropriately relocated on the screen, and then on to block 146. If other than a cursor or start key was pressed, block 130 directs the program to block 132 which redirects flow to block 134 if other than an increment or decrement key was pressed. Block 134 generates an error message and then passes program operation back to block 128. If an increment or a decrement key was pressed then block 132 direct program operation to block 136.

In block 136 the program checks to see if the channel multiplexer setting (−5 to +5 nS) for the selected channel or field 62 is already at its upper or lower limit. If the increment key was pressed with the channel multiplexer setting already at +5, or if the decrement key was pressed with the setting already at −5, then the setting remains unchanged and the program returns to block 128. Otherwise program flow is directed to block 138 where the channel delay time displayed in fields 62 and 64 is increased or decreased by 1 nS according to whether the increment or decrement key was pressed. Next in block 140 the program determines whether the currently selected pod in field 58 is the same as the reference pod of field 50. If not, then program flow passes back to block 128 with no further display changes. If the reference channel delay time has been changed, block 140 passes program flow to block 142 where the reference channel delay times displayed in fields 54 and 56 are modified. Then in block 144 the delay times of all channels displayed in fields 62 and 64 are adjusted to account for the new reference channel delay time. from block 144 the program returns back to block 128.

If the last key pressed in blocks 72, 94, 108 or 128 was a start key, then the program passes through blocks 92, 106 and 126 to block 146. Block 146 directs program flow to block 148 where the timing data for controlling the switching positions of all of the multiplexers in the pods 16 is determined from the delay time data entered into field 60 for each pod clock and into fields 62 for each channel of each pod. Then block 150 initiates the signal pattern generating operation. When the signal generating operation is complete, block 150 directs return to block 152 where other fields in the menu (not shown) may be accessed and then to block 154 where other functions of the signal generator are performed. These other functions may include the loading of data into the pattern memory, the specification of the order in which the data stored in the pattern memory is to be read, and the setting of system clock rate. These other functions of the signal generator are not new and are not further detailed herein.

Thus the operator can change the timing delays associated with the test signals generated by the signal generator by changing a graphical display of the timing data to match a similar graphical depiction of test signals as may be specified by a manufacturer of equipment to be tested. It is not necessary that he input numerical delay times in order to change that display. Rather the operator selects the appropriate channel and then uses an increment or a decrement key to change the displayed channel time delay until it appears to be graphically the same as the manufacturer's test signal specification chart. This permits quicker adjustment of the delay times and helps reduce errors in setting those times by providing immediate, graphical feedback to the operator of the changes he has made in signal timing.

A listing of a Pascal program generally implementing the flowchart of FIG. 4 is included in Appendix I to this specification.

While a preferred embodiment of the present invention has been shown and described, it will be apparent to those skilled in the art that many changes and modifications may be made without departing from the invention in its broader aspects. For instance, the graphical timing data input method of the present invention could be used in conjunction with any apparatus requiring the adjustment of relative timing of a signal event and is not limited to use in conjunction with a signal generator as described herein. Also other means could be provided to allow the operator to modify the signal timing display other than increment and decrement keys. For instance in an alternative embodiment the operator could place a cursor in a selected place on one of the channel timing displays in field 64 by operating the cursor keys. When the cursor is located under a selected delay time (−10 to +10), a select key could be pressed causing the timing delay to change to the selected delay time. The appended claims are therefore intended to cover all such changes and modifications as fall within the true spirit and scope of the invention.

APPENDIX I for patent application entitled

GRAPHICAL INPUT OF TIMING RELATIONSHIPS

25-FEB-85 15:29:38      Page:    1

```
(*$R-, Z+ *)

unit pat_setup, 48;

(** FUNCTION : SETUP & TIMING menu of pattern generator for DAS 9100.    **)

interface (*$U dasrunti.ifc *)
    USES DASRUNTIME;
Unit DAS_Runtime;
```

```
(*$M 01 *)

(***************************************************************)
   (***************************************************************)
   (**                                                           **)
   (**          COPYRIGHT (C) JULY 1980 TEKTRONIX, INC.          **)
   (**                    ALL RIGHTS RESERVED.                   **)
   (**                                                           **)
   (**    Tektronix Software products, including all associated  **)
   (**    documentation, remain the sole property of Tektronix,  **)
   (**    inc., and may not be copied in whole or in part, or    **)
   (**    otherwise reproduced in any form without the express   **)
   (**    written premission of Tektronix, inc. all copies and   **)
   (**    reproductions shall be the property of Tektronix and   **)
   (**    must bear this copyright notice and ownership state-   **)
   (**    ment in its enterety.                                  **)
   (**                                                           **)
   (***************************************************************)
   (********************** DAS - 9100 *****************************)
   (***************************************************************)
(*$TDAS 9100 Runtime Routines -- Interface -- Const *)

Const
      ID91A32 = 16#80   (* 32/40   *);
      ID91A08 = 16#81   (* 8/10    *);
      ID91A24 = 16#82   (* 24/100  *);
      ID91A04 = 16#83   (* 4/3     *);
      ID91W32 = 16#85   (* 91W32   *);
      ID91W16 = 16#04   (* 91W16   *);
      ID91T01 = 16#06   (* 91T01   *);
      ID_IO   = 16#07   (* IO      *);
      ID_OPT6 = 16#08   (* IO&OPT6 *);
      ID91S16 = 16#13   (* 91S16   *);
      ID91S32 = 16#14   (* 91S32   *);

MAX_CHANNEL = 103;          (* 104 acquisition channels maximum  *)
      MAX_SLOT    = 15;           (* 16 card slots if expander box     *)

STAND_ATT   = 16#00;
      ATT_GREEN   = 16#80;        ATT_REV_GREEN  = 16#90;
      ATT_YELLOW  = 16#81;        ATT_REV_YELLOW = 16#91;
      BLINK_ATT   = 16#82;

BRD_91T01 = 16#07;          (* slot number of trigger card        *)
      BRD_91TOX = 16#0F;          (* slot number of expander trigger card *)
      UNIT_MAX  = 63;             (* maximum number of units (menus)    *)
(*$T DAS 9100 Runtime Routines -- Interface -- Type *)

Type
      COLUMN    = 0..79;
      LINE      = 0..23;
      BYTE      = 0..255;
      ATTRIBUTE = 0..255;

UNIT_CALLS = (POWER_UP,         (* SOFT_INIT & DIAG_VERIFICATION    *)
                    SOFT_INIT,        (* Init vars, set menu defaults     *)
                    MENU,             (* Display menu until key in menu_keys *)
                    CONFIG_CHANGE,    (* Configuration has changed        *)
                    REPORT,           (* Outer vars just saved            *)
                    REPORT_SIZE,     (* REP_SIZE:= number of extra blocks *)
                    PRE_RESTORE,      (* Outer vars are about to be restored *)
                    RESTORE,          (* Vars just restored or extra status *)
                    DISPLAY_ID,       (* Display card name on screen      *)
                    DIAG,
                    DIAG_QUREY,
                    DIAG_VERIFICATION,(* Perfrom power_up Self test       *)
                    POST_RESTORE,     (* All units are done being restored *)
                    OUTER_VAR_RESTORED,(* Outer vars have just been restored *)
                    RESTORE_BEGIN,    (* This unit will be restored       *)
                    FIX_TRG_WORDS,    (* channel has changed chan grouping *)
                    SHOW_TOP,         (* show the top portion of trigger  *)
```

```
                    HANDLE_FIELD,
                    STOP_CARD,
                    LOAD_CARD,
                    CAL_INFO,
                    PRE_ACQ,
                    POST_ACQ,
                    WAIT_4_TRIG,
                    WAIT_STOP,
                    SHOW_BOTTOM,
                    CHK_EXIT,
                    PON_CURSOR,
                    READ_CLK_ARRAY,
                    PRE_ARMS,
                    PRE_PART3,
                    pg_start_setup,
                    pg_dsp_trace,
                    pg_keep_alive,
                    pg_stop_setup,
                    pg_gpib_setup );

INTEGER_PT = ^INTEGER;

CURSOR_DISP = (ON, OFF);

FORMAT = (INPUT, VERIFY);

FIELD_POINTER = ^FIELD_TABLE;
    FIELD_TABLE = Packed record
      NEXT_FIELD: FIELD_POINTER;
      Y_POS: BYTE;
      START: BYTE;           (* Starting position of field *)
      STOP:  BYTE;           (* ending column of the field *)
      FIELD: BYTE;           (* Field number from MOVE_CURSOR *)
      SUB:   BYTE;           (* Sub field num.  Retruned in Var SUB_FIELD *)
      GPIB:  BYTE;           (* Indended for GPIB use *)
    end;

KEYS=                      (**** Key codes for the keyboard ****)
(*$L+*)
                                       25-FEB-85 15: 38    Page:    5

(*$TDAS 9100 Runtime Routines -- Interface -- Var*)

Var
      syscom: SYSPTR;              (* Pointer to syscom -- must be 1st var      *)

cursor_X: COLUMN;            (* Blinking cursor X and Y position          *)
      cursor_Y: LINE;
      key     : KEYS;              (* Last key read by read_key                 *)

new_field: BOOLEAN;          (* Indicates if the cursor was moved to a    *)
                                   (* different field by the last call to       *)
                                   (* MOVE_CURSOR.                              *)

old_field: BYTE;             (* Move_cursor own variable -- don't use     *)
      cur_field: BYTE;             (* The number of the field we're in          *)
      cur_start_field: BYTE;       (* The start of the current field            *)
      cur_stop_field: BYTE;        (* and the end of the current field          *)
      sub_field: BYTE;             (* Sub field number of current field         *)
      dead_fields: FIELD_POINTER;  (* Unused Heap from delete_field             *)
      fell_off_bottom: BOOLEAN;    (* Indicates if we tried to go off the       *)
                                   (*   bottom of the screen                    *)

ready_to_calculator: BOOLEAN; (* Indicates if we are to enter             *)
                                    (*   calculator style for decimal           *)

mp_present: boolean;         (* GPIB message processor present            *)
      learn_mode: boolean;         (* GPIB learn mode                           *)

boards: Packed array [0..MAX_SLOT] of BYTE; (* card ID values             *)
```

```
bin_digits, oct_digits, dec_digits, hex_digits:  Set of KEYS;
alpha_numeric_keys, word_gen_keys, menu_keys:    Set of KEYS;
action_keys, cursor_keys, exit_keys:             Set of KEYS;

(* Pointers to a unit's global interface record *)
chan_pointer, state_pointer, word_pointer,
trig_pointer, IO_pointer, tabl_pointer, start_pointer,
prg43_pointer, numonic_pointer, card_pointer, future4,
s16_pointer: INTEGER_PT;

what_to_do: UNIT_CALLS;      (* Unit's entry dispatch Function       *)
result: BOOLEAN;             (* FALSE --> power_up self test errors  *)
action: BOOLEAN;             (* TRUE --> enable action_keys from idle *)

(* Idle loop own Variables -- don't use *)
old_pod_present: packed array[0..max_slot] of 0..16#F;
old_mos_status:  packed array[0..max_slot] of 0..16#F;

screen: Packed array [LINE,COLUMN] of CHAR; (* The CRT screen buffer  *)
(*$P*)
    rep_size: INTEGER;          (* Number of extra blocks of data for REPORT *)
                                (*   and RESTORE -- i.e. pat gen vectors.   *)
    num_of_units: integer;      (* Number of units in the unit table        *)
    utbl: xutbl;                (* Pointer to unit table -- see interpreter *)

(* RS-232 own variables -- don't use *)
key_RS232: KEYS;
chksum: CHECK_ARRAY;         (* Screen line checksums for slave           *)
ck_line: line;
ck_column: column;

unit_aray: Packed array       (* Contains unit number to be called when a *)
    [CH_START..CH_NOP] of 0..unit_max; (* key in menu keys is pressed     *)

dummy_buf: packed array[0..82] of byte;

(* GPIB Variables *)
indicate_error: boolean;     (* An error message is on the screen         *)
das_cursor: boolean;
sav_heap:^integer;

debugging: boolean;          (* TRAC routine / readkey debug flag         *)

(* Following reserved for use with patches *)
trigsel_ptr: integer_pt;         (* pointer to trigsel data structures *)
ptr_91A24: integer_pt;           (* pointer to 91A24 data structures *)
cur_fld_pointer: integer_pt;     (* pointer to current field struct *)
cur_direct_key: integer_pt;      (* pointer to current direct key *)
auto_key: keys;                  (* start key to be used for auto mode *)
auto_restart: boolean;           (* Auto restart mode?? *)
srt_info_ptr: integer_pt;        (* ptr used for info interchange *)
save_done_menu: keys;    (* to reset done menu after call to gpib menu *)
NewAcqFlag: boolean;         (* used to tell gpib menu to send acq next *)
Now_Printing: boolean;   (* used by GPIB to signal PRINT command active *)
Screen_Update: boolean;  (* used by GPIB to keep track of screen on/off *)
printio_pt : integer_pt; (* pointer to printer record, print_info *)
Patch_Vars: array[0..18] of integer;
sys_start_var: integer;  (* save cntl0 (addr 2, trig) for pat gen *)

CUR_ON_OFF: cursor_disp; (* CURSOR IS ON OR OFF, USED BY RS232 *)

no_fields: boolean;  (* no fields on screen, means don't turn cursor on *)

YES_COMM_ERR,OUT_RS232: BOOLEAN; (* USED BY RS232 ROUTINES *)
need_to_send: boolean;
Ref_heap_sav: integer_pt;   (* Used by STATE_TABL in restoring heap ptrs *)
(*$T DAS 9100 Runtime Routines -- Interface -- Procedures *)

Procedure Print_error;  (* Called from interpreter -- Must be first Procedure *)
                                                    (*** RS-232 debugging ***)
Procedure Write_num(num, base, width: INTEGER);
Procedure Write_string(strng: STRING);
Function  Read_num(base: INTEGER): INTEGER;
```

```
Procedure Read_string(Var strng: STRING);
Procedure Write_line;
                                                        (*** Screen output ***)
Procedure Num_out(x: COLUMN; y: LINE; num,base,width: INTEGER; att: ATTRIBUTE);
Procedure Num_to_string(num,base,width: INTEGER; Var buf: DIG_BUF;
                blank: BOOLEAN; digits: DIG_BUF);
Procedure String_out(x: COLUMN; y: LINE; strng: STRING; att: ATTRIBUTE);
Procedure Select_out(x: COLUMN; y: LINE; list,choice: INTEGER; att: ATTRIBUTE);
                                                        (*** Screen input ***)
Procedure String_in(Var direct: KEYS; Var strng: STRING; fmt: FORMAT);
Function  Alpha_in(Var direct: KEYS): CHAR;
Function  Select_in(Var direct: KEYS; list: INTEGER; fmt: FORMAT): INTEGER;
Function  Num_in(Var direct: KEYS; base: INTEGER; fmt: FORMAT;
            Var mask: INTEGER): INTEGER;
Procedure Readkey;
                                            (*** Editable field manipulation ***)
Procedure Template(pattern: INTEGER);
Function  Move_cursor(direct: KEYS; tabl: INTEGER): INTEGER;
Function  Leaving_field: BOOLEAN;
Function  Delete_field(field: INTEGER; tabl: INTEGER): INTEGER;
Function  Add_field(x, y, leng, field_num, sub_field_num: BYTE;
                GPIB_num: BYTE; tabl: INTEGER): INTEGER;
                                                    (*** Screen Utilities ***)
Procedure Clear_screen;
Procedure Erase_EOL(x: COLUMN; y: LINE);
Procedure Erase_EOS(x: COLUMN; y: LINE);
Procedure Scroll_up(row, n: LINE);
Procedure Scroll_down(row, n: LINE);
Procedure Set_cursor(x: COLUMN; y: LINE; show: CURSOR_DISPLAY);
                                                (*** Error message display ***)
Procedure Message(msg: STRING);
Procedure Quiet_message(msg: STRING);
Procedure Standard_message(choice: integer);
Procedure Beep(syscon_beeper, duration, frequency: INTEGER);
Procedure Highlight(scrptr: INTEGER_PT; xlen: INTEGER);
                                                        (*** Idle loop ***)
Function  Idle: boolean;
Function  Get_status(slot,port: byte): BYTE;
Procedure New_event(event_code: byte);
Procedure Dispatch;
                                                        (*** Miscellaneous ***)
Procedure Read_acq(mem: integer_pt; mem_bit,lead,mar,C_Type,slot: integer);
Function  Checksum(int_ptr: integer_pt): INTEGER;
Procedure Trac(s: string; n: integer);
Procedure Concat(Var dest: string; source: string);
                                                        (*** RS232 ROUTINE ***)
Function Ck_rs232: BOOLEAN;

Function[43] Nascii_to_chascii(nas: keys): char;
Procedure [46] Do_readacq( mem: integer_pt; step, size: integer; pod: byte;
   Virtual_MAR: integer; C_type: byte; slot: byte);
Function [47] Interrupt( valid_keys: key_set; wait_for_key_press: boolean):
   boolean;
Function [48] Test_get_unit( unit_num: integer): boolean;

function [49] get_new_status(slot: byte; ptr: integer_pt): byte;

function [50] new_probe(id: byte): boolean;

function [51] pod_mask(id: byte): byte;

USES GPIB_MP;
(*$P*)

uses chan_spec;
(*$P*)

IMPLEMENTATION (*$U sonypatg.ifc *)
  USES SONY_PAT_GEN;
UNIT SONY_PAT_GEN, 43;
```

```
  USES DASRUNTIME;
  USES START;
  USES PRINTIO;
  USES PG_START;
  USES WORD_OVER;
  USES EDIT_OVER;
  USES HARDIN;

CONST
  FIRST_LINE       = 7;          (* first line of program field *)
  LAST_LINE        = 21;         (* last line of program field *)

MAX_LABELS       = 15;         (* max number of labels *)

SEQ_CON_SPACE    = 0;          (* local code of instruction *)
                                 (* seq flow and control are not set yet *)
  TRIGGER          = 1;          (* control *)
  INCR_PAGE        = 2;

SEQ_FLOW         = 3;          (* seq flow *)

PG_HALT          = 3;
  PG_JUMP          = 4;
  PG_IF_RA         = 5;
  PG_IF_RB         = 6;
  PG_IF_R          = 7;
  PG_IF_IRQ        = 8;
  PG_IF_EXT        = 9;
  PG_IF_KEY        = 10;
  PG_IF_FULL       = 11;
  PG_IF_END        = 12;
  PG_RETURN        = 13;
  PG_CALL_RMT      = 14;

EDIT_SEQ_CON     = 15;         (* edit seq flow and cotrol *)

REG_OUT_SPACE    = 16;         (* reg and out are not set yet *)

OUT              = 17;         (* out *)

PG_OUT_RA        = 17;
  PG_OUT_RB        = 18;
  PG_OUT_R         = 19;
  PG_OUT_REP       = 20;

REG_RA           = 21;         (* register ra *)

PG_LOAD_RA       = 21;
  PG_INCR_RA       = 22;
  PG_DECR_RA       = 23;

REG_RB           = 24;         (* register rb *)

PG_LOAD_RB       = 24;
  PG_INCR_RB       = 25;
  PG_DECR_RB       = 26;

REG_R            = 27;         (* register r *)

PG_LOAD_R        = 27;
  PG_INCR_R        = 28;
  PG_DECR_R        = 29;

EDIT_REG_OUT     = 30;         (* edit reg and out *)

S16_S            = 12;         (* array number of pg_radix and etc... *)
  S16_I            = 13;
  S16_M            = 14;
  S16_RB           = 15;
  S16_RA           = 16;
  S32_S            = 17;
  S32_I            = 18;
```

```
  SUBMENU_START    = 27;            (* start x address *)
  SUBMENU_1_START  = 28;

MODE_START       = 72;
  MODE_1_START     = 73;

START_START      = 74;

SEQ_START        = 2;
  SEQ_M_2_START    = 0;
  SEQ_3_START      = 5;
  SEQ_5_START      = 7;
  SEQ_6_START      = 8;
  SEQ_8_START      = 10;

LABEL_START      = 9;
  LABEL_M_2_START  = 7;
  LABEL_5_START    = 14;
  LABEL_7_START    = 16;

PAGE_START       = 76;
  PAGE_1_START     = 77;

TR_SEQ_START     = 9;
  TR_PAT_START     = 16;
  BREAK_START      = 74;

EX_RUN0 = 32;                     (* expansion run mode field number *)
  EX_RUN1 = 33;

EX_RUN10 = 42;
  EX_RUN11 = 43;
  EX_RUN12 = 44;
  EX_RUN13 = 45;

EX_RUN23 = 55;
  EX_RUN24 = 56;
  EX_RUN25 = 57;
  EX_RUN26 = 58;
  EX_RUN27 = 59;
  EX_RUN28 = 60;
  EX_RUN29 = 61;

M_TR0 = 21;                       (* main trace mode field number *)
  M_TR1 = 22;

TYPE
(* program *)
  PG_SLOT_TYPE= packed array [ 0..5 ] of BYTE;
                                    (* slot type *)
  PROG_LINE    = FIRST_LINE..LAST_LINE;
                                    (* range of program line *)
  ORDER_TYPE   = packed array [ 0..13 ] of BYTE;
                                    (* group ordering type *)
  DSP_ARRAY_TYPE
               = packed array [ 0..S32_I ] of BYTE;
                                    (* array type for edit display *)
  SEQ_LABEL    = packed array [ 0..3 ] of CHAR;
                                    (* label type *)
  SEQ_ARRAY    = array [ PROG_LINE ] of INTEGER;
                                    (* sequence number *)
  TABLE_ELEMENT = record
      name:      SEQ_LABEL;         (* label name *)
      loc:       INTEGER;           (* loc: label location *)
    end;

LAB_TABLE    = packed array [ 1..MAX_LABELS ] of TABLE_ELEMENT;
                                    (* label table *)
  READ_VEC_TYPE
               = packed array [ 1..6 ] of BYTE;
                                    (* read vector type *)
  INST_SET     = set of 0..30;      (* instruction *)
```

```
I_EXIST_TYPE= packed array [ PG_IF_IRG..PG_CALL_RMT ] of BOOLEAN;
                                      (* inst_exist type *)
DEST_IND    = packed array [ 0..1023 ] of 0..MAX_LABELS;
                                      (* label table index for destination *)
(* configuration *)
  CHANNEL_NUM = 0..10;                (* number of timing depth *)
                                      (* 0:-5ns..10:+5ns *)
  CH_GR_NUM   = 1..24;                (* number of configuration group *)
  BITS_4      = 0..16#F;              (* 4 bits *)

probe6464_record = record
    add_4f_16: packed array [ 0..3 ] of bits_4; (* address 16#4F for P6464 *)
    add_2f_16: packed array [ 0..7 ] of bits_4; (* address 16#2F for P6464 *)
    delay_array: packed array [ 0..8, 0..3 ] of bits_4; (* delay ns for P6464 *)
  end;

tmg_conf_record = packed record
    f_chan_ns:   packed array[0..8] of channel_num;
                                      (* timing menu: channel *)
    pod_type:    byte;                (* bit 7-4: slot number, *)
                                      (* bit 3-0: pod number *)
    clock_wid:   0..2;                (* 0: -5nS, 1: 0nS, 2: +5nS *)
    f_out_level: 0..1;                (* 0: TTL, 1: ECL *)
    f_cl_pol:    0..1;                (* 0: 0, 1:1 *)
    f_cl_inh:    0..1;                (* 0: 0, 1:1 *)
    f_str_inh:   0..1;                (* 0: up, 1: down *)
  end;

f_sub_array = packed record
    f_logical:   0..2;                (* 0:ONLY, 1:AND, 2:OR *)
    f_sub:       0..1;                (* 0: INTERNAL 0, 1: INTERNAL 1 *)
                                      (* 0: EXTERNAL 0, 1: EXTERNAL 1 *)
  end;

S16_S32_RECORD = PACKED RECORD
  (* program *)
    pg_top_heap:      ^INTEGER;       (* top heap *)
    pg_field_list:    INTEGER;        (* field list *)
    s32_start_num:    INTEGER;        (* start number for s32 *)
    last_grp_order:   INTEGER;        (* last array_num of group_order *)
                                      (* -1 is all "OFF" *)
    start_range:      INTEGER;        (* edit start num *)
    end_range:        INTEGER;        (* edit end num *)
    dest_range:       INTEGER;        (* edit destination num *)
    num_of_srch:      INTEGER;
    ratio:            INTEGER;
    clock_num:        INTEGER;        (* clock in program trace/step mode *)

pg_dir:           KEYS;           (* direct *)

(* configuration *)
    end_aseq_num:     integer;        (* s32 *)
    end_min_aseq:     integer;        (* FOLLOWS 91S16: 0 *)
                                      (* ELSE: 8191 - end_aseq_num *)
    repeat_num:       integer;        (* s32 *)

(* program *)
    inst_group:       INST_SET;       (* inst_group must be here. ( 4 bytes ) *)
    seq_code:         BYTE;           (* instruction code *)
    out_code:         BYTE;
    reg_ra_code:      BYTE;
    reg_rb_code:      BYTE;
    conv_pod:         BYTE;           (* conversion pod *)
    from_pod:         BYTE;           (* copy from pod *)
    to_pod:           BYTE;           (* copy to pod *)

(* configuration *)
    cont_reg7:        byte;
    cont_reg8:        byte;
    cont_reg9:        byte;
```

```
        cont_regB:              byte;

s32_io_9_reg:           byte;
        s32_io_A_reg:           byte;
        s32_io_D_reg:           byte;

(* setup *)
        var_volt:               0..255;       (* VAR *)
        clock_gate:             byte;         (* inhibit flag for 91S32 H/W *)
        my_clk_mode:            BYTE;         (* for tape save/restore *)
        my_times:               BYTE;
        my_clock_rate:          BYTE;
        my_dac_value:           BYTE;
        my_thrs_hold:           BYTE;

(* program *)
        pg_slot:                PG_SLOT_TYPE;
                                    (* slot number *)
        s_i_m_chan:             packed array [ S16_S..S32_I ] of BYTE;
                                    (* channel num of s, i and m *)
        group_order:            ORDER_TYPE;(* group order for display *)
        start_x_pos:            DSP_ARRAY_TYPE;
                                    (* start x addres of group in program *)
        size_num:               DSP_ARRAY_TYPE;
                                    (* size num of group in program *)
        data_list:              packed array [ 0..255 ] of BYTE;
                                    (* table conversion data *)
        edit_box1:              packed array [ 1..30 ] of BYTE;
                                    (* data of edit pattern *)
        edit_box2:              packed array [ 1..30 ] of BYTE;
                                    (* don't care of edit pattern *)
        sym_ind:                packed array [ 0..1023 ] of 0..MAX_LABELS;
                                    (* index to symtab(label table) *)
        width_num:              packed array [ 0..S32_I ] of 0..4;
                                    (* width of group in program *)

(* configuration *)
        s32_io_B_reg:           packed array[0..5] of byte;
                                    (* S32 *)
        s32_io_C_reg:           packed array[0..5] of byte;
                                    (* S32 *)

(* program *)
        ed_destination:         SEG_LABEL; (* edit destination *)

sym_tab:                LAB_TABLE; (* label information *)
        lab_index:              BYTE;      (* index to label table *)
                                    (* sym_tab and lab_index must be here *)

crt_line:               SEG_ARRAY; (* sequence number for 91s16 display *)
        common_crt_line:        SEG_ARRAY; (* sequence number for 91s16/32 display *)
        tbl_seq_box:            SEG_ARRAY; (* sequence number for table display *)
        inst_exist:             I_EXIST_TYPE;
                                    (* information for setup/configuration *)
        pg_radix:               packed array [ 0..18 ] of 0..3;
                                    (* radix *)
    (* configuration *)
        ch_groups:              packed array[ch_gr_num] of tmg_conf_record;
                                    (* data of timing and configuration *)
        probe_data:             array [ 0..5 ] of probe6464_record;
                                    (* data for P6464 *)
    (* setup *)
        f_sub_inh:              packed array[1..4] of f_sub_array;
                                    (* inhibit sub flag *)
        lable:                  string[4]; (* label of interrupt jump *)

(* program *)
        ed_label:               STRING[ 4 ];
                                    (* edit search label *)
        ed_jump_label:          STRING[ 4 ];
                                    (* edit jump label *)
        incr_exist:             BOOLEAN;   (* incr page instruction exist or not *)
        reg_exist:              BOOLEAN;   (* register instructions exist or not *)
```

```
    irq_issue:            BOOLEAN;
    break_stop:           BOOLEAN;       (* stopped at breakpoint or not *)

(* configuration *)
    s32_only_ok:          boolean;       (* TRUE: 91s32 stand alone *)
    s16_only_ok:          boolean;       (* TRUE: only 91s16 *)
    f_check:              BOOLEAN;       (* check flag *)

(* setup *)
    and_flag:             BOOLEAN;       (* TRUE: inhibit internal and external *)

(* program *)
    display_num:          0..1;          (* 0: 91S16, 1: 91S32 *)
    break_on_off_num:     0..1;          (* 0: OFF, 1: ON *)
    aseq_num:             0..1;          (* 0: aseq, 1: rseq *)
    edit_con_num:         0..1;          (* edit conversion - 0: convert  *)
                                         (*                   1: table build *)
    ed_copy_num:          0..1;          (* 0: line, 1: group *)
    from_to_num:          0..1;          (* table flag *)

(* configuration *)
    f_regist:             0..1;          (* 0: 8bits + 8bits, 1: 16bits *)
    f_s32_mode:           0..1;          (* 0: Follows 91S16, 1: Sequential *)
    f_only_mode:          0..1;          (* 0: Repeat, 1: Free Run *)
    cf_mode:              0..1;          (* configuration mode *)
                                         (* 0:s16, 1:s32    *)
    f_reloads:            0..1;          (* 0: OFF, 1: ON *)

(* setup *)
    setup_num:            0..1;          (* setup mode 0:s16, 1:s32 *)
    f_if_call:            0..1;          (* 0:"IF IRQ" ON, 1:CALL *)
    f_qual_num:           0..1;          (* 0:0, 1:1 *)
    m_qual_num:           0..1;          (* 0:TRUE, 1:X *)
    my_level:             0..1;          (* for tape save/restore *)

(* program *)
    mode_num:             0..2;          (* 0: run, 1: trace, 2: step *)
    modify_num:           0..2;          (* 0: and, 1: or, 2: xor *)
(* configuration *)
    clock_div16:          0..2;          (* S16 divited by ... 0: 1, 1: 2, 2: 4 *)

(* setup *)
    f_th_level:           0..2;          (* 0:TTL, 1:VAR, 2:ECL *)
    f_irq:                0..2;          (* 0:NEVER, 1:up, 2:down *)
    f_ext:                0..2;          (* 0:NEVER, 1:0, 2:1 *)

(* program *)
    cur_line_num:         1..3;          (* line num per one sequence *)
    f_inh:                0..4;          (* 0:NEVER, 1:EXTERNAL 0, 2:EXTERNAL 1 *)
                                         (* 3: INTERNAL 0, 4: INTERNAL 1 *)

(* program *)
    srch_par_num:         0..6;          (* edit search parameter - 0: label    *)
                                         (*                         1: pattern  *)
                                         (*                         2: seq flow *)
                                         (*                         3: jump label *)
                                         (*                         4: control  *)
                                         (*                         5: reg      *)
                                         (*                         6: out      *)
    edit_num:             0..8;          (* 0: conversion, 1:copy, 2:delete *)
                                         (* 3: display, 4: fill, 5: insert *)
                                         (* 6: modify, 7: move, 8: search *)
    data_bits:            0..9;          (* table flag *)
    code_bits:            0..9;          (* table flag *)

(* setup *)
    f_ref_channel:        0..9;          (* timing menu: reference channel *)

(* setup *)
    f_ref_ns:             0..20;         (* timing menu: reference depth *)

(* program *)
    seq_cur_pos:          PROG_LINE;     (* cursor position in 91s16 run mode *)
```

```
        ex_cur_line:            PROG_LINE;  (* cursor position in 91s32 run mode *)
        tbl_cur_line:           PROG_LINE;  (* cursor position in table *)

(* setup *)
        st_last_y:              LINE;       (* setup menu last line *)

(* program *)
        pg_last_y:              LINE;       (* program last y address *)
        tr_line_num:            LINE;       (* first display position *)

(* configuration *)
        cf_last_y:              LINE;       (* configuration menu last line *)
        last_data:              0..24;      (* number of configuration data(pods) *)
        cf_first_gr:            0..25;      (* first group in configuration menu *)

(* setup *)
        ref_cur_num:            0..25;      (* timing menu reference group *)
        cur_num:                0..25;      (* timing menu cursor group *)

(* program *)
        seq_srch_num:           0..30;      (* edit search instruction code *)
        cont_srch_num:          0..30;
        out_srch_num:           0..30;
        reg_srch_num:           0..30;

(* setup *)
        st_last_x:              COLUMN;     (* setup menu: last column *)

(* configuration *)
        cf_last_x:              COLUMN;     (* configuration menu: last column *)

(* program *)
        seq_con_x:              COLUMN;     (* seq, control x address *)
        reg_out_x:              COLUMN;     (* reg, out x address *)
        dest_x:                 COLUMN;     (* destination x address *)
        pg_last_x:              COLUMN;     (* program last x address *)
        control_x:              COLUMN;     (* trace control x address *)
        s16_start_num:          0..1023;    (* start number for s16 *)
        break_num:              0..1023;    (* break number in trace mode *)
        max_seq_num:            0..2047;    (* max sequence number *)

(* for future *)
        pg_future:              array [ 0..4 ] of INTEGER;

END; (* RECORD *)

procedure init_edit( range_ok, pod_ok, inst_ok, other_ok: BOOLEAN );

procedure init32_getup( slot_num: BYTE; mid_seq: INTEGER; max_seq: INTEGER );

procedure pg_stop_check;

procedure del_exe_message;

procedure gr_ordering( rdx_chk_ok: BOOLEAN; var ordering: ORDER_TYPE );

procedure read_instruction( s16_slot: BYTE; seq_num: INTEGER;
                  f_regist, f_irq, f_if_call: BYTE;
                  inst_gr_pt: INTEGER_PT; var temp: READ_VEC_TYPE;
                  inst_gr_set_ok: BOOLEAN );

function num_of_seq: INTEGER;

procedure fillscreen( line_0_1_erase_ok, edit_erase_ok: BOOLEAN;
                  first_pos: LINE; srch_seq_num: INTEGER );

function pg_leaving_field: BOOLEAN;

function check_max_min(num, max_num, min_num: INTEGER;
                  left_by_inst: BOOLEAN): BOOLEAN;

function search_name( lab: SEQ_LABEL; sym_tab: LAB_TABLE;
                  dup_check: BOOLEAN ): BOOLEAN;
```

```
function  search_loc( spot: INTEGER; symtab: LAB_TABLE ): BOOLEAN;

function insert_label( lab: SEG_LABEL; addr: INTEGER ): BOOLEAN;
procedure clear_label_table;

procedure delete_ref( array_num: INTEGER );

procedure write_loc( slot_num, f_irq, f_if_call: BYTE; loc, seq_num: INTEGER );

procedure in_label;

function check_label: BOOLEAN;

procedure leave_s16_run;

function count_instruction( s16_slot, f_irq, f_if_call: BYTE;
                            var inst_exist: I_EXIST_TYPE ): INTEGER;

IMPLEMENTATION (*$U setuphar.ifc *)
  USES SETUP_HARDIN;

unit setup_hardin,46;

USES DASRUNTIME;
  USES SONY_PAT_GEN;
  USES PAT_CONFIGURATION;
  USES PAT_SETUP;
  USES GET_UP;
  USES PG_START;

type
  tmp_ch_gr_num = 1..24;
  temp_buf      = packed array [ 1..6 ] of byte;

procedure data7_entry( bit_num: byte );
procedure data8_entry;
procedure data9_entry( pod_or_reg: boolean; cur_group: byte );
procedure dataB_entry;

procedure jp_save_clock;

procedure pat_message( choice: integer );
procedure write_to_hard( temp_vec: temp_buf );
procedure irq_set;

function  seq_1023_check: boolean;
function  if_call_check: boolean;
procedure check_setup;
function  check_call_label: boolean;

function  incr_decr_in( max_num: integer; var num: integer;
                        select_ok: boolean ): boolean;
function  num2_in( fmt: format ): integer;
function  pod_file( tmg_pod_ok: boolean ): byte;

procedure s16_pc( slot: byte; seq_num: integer );
procedure pat16_set( temp: temp_buf; slot_num: BYTE );

procedure pat_inh;
procedure pattern_out( y: line; seq_num: integer );
procedure pattern_edit;
procedure pattern_in( y: line; seq_num: integer );

procedure call_sub_menu;
``` implementation

```
(*$U chanspec.ifc *)
  USES CHAN_SPEC;
Unit Chan_spec.3;
Uses DAS_Runtime;

(*$T Chan_spec -- Interface Data Structures *)

Const
  max_bits = 119; (* number of entries in the Chan_bits array -- allows *)
                  (*  for 16 duplicate channels while in the chan_spec  *)
  num_bits = 120; (* max_bits+1 *)
  max_pods = 13;

TTL = 0; VARIABLE = 1; (* For accessing threshold level *)

Type
  group_range = 16#A..16#19; (* A..F, 0..9 *)
  one_per_group = packed array[group_range] of byte;
  pod_range = 0..max_pods;
  chan_range = 0..max_channel;
  c_types = (C_NONE, (* Assumed to be 0 *)
             C_91A32, C_91A08, C_91A04, C_91W16, C_91A24, C_NEW2);

group_rec = record
    index: byte; (* Index to chan_bits structure *)
    radix: byte; (* 0 --> HEX, 1 --> OCT, 2 --> BIN *)
    size: byte;  (* number of chars when displayed in above radix *)
    num_of_channels: chan_range; (* Number of channels in this group *)
    pol:    0..1;
    num_of_pods: pod_range;
    card_type: c_types;  (* C_NONE --> don't display group *)
    tables: boolean;     (* TRUE --> disassembly table for this group *)
  end; (* group_rec *)

bit_rec = packed record (* msb to lsb order *)
    board_number: byte;  (* The chan_spec menu relies on this data *)
    lead_number: byte;   (*  structure being 2 bytes for moveleft  *)
  end; (* bit_rec *)

thresh_rec = packed record
    DAC_value: byte;
    DAC_high: 0..16#3F;
    level: 0..1;
  end; (* threshold_rec *)

chan_record = record
    chan_groups: packed array[16#A..16#19] of group_rec;
    chan_bits: packed array[0..max_bits] of bit_rec;
    display_order: packed array[0..15] of byte; (* index to chan_groups *)
    chan_threshold: packed array[1..max_slot] of thresh_rec;
  end;

card_ptr = ^card_info;

card_rec = packed record
              channels: byte;        (* num of channels/card - 1 *)
              ctype: ctypes;         (* card type for card *)
              max_bytes: byte;       (* num of pods on the card *)
              old_style: boolean;    (* old_style = true - allocate like 91A32 *
              name: string[5];       (* CHASCII name of card *)
              priority: byte;        (* priority for allocation of groups *)
              step: byte;            (* threshold step value *)
              thrs_min: integer;     (* lminimum threshold DAC value *)
              thrs_max: integer;     (* hmaximum threshold DAC value *)
              memory_depth: integer; (* memory depth in number of bytes *)
              pod_mask: byte;        (* the pod mask used by the idle loop *)
              new_probes: boolean;   (* whether or not the card has new probes *
              extra: string[7];      (* filler - for future things *)
            end;

card_info = packed array[ID91A32..ID91W32] of card_rec;
```

```
(* To use the channel spec data structures, other menus should  *)
(*   declare:                                                    *)
{VAR}
{chan_data: ^chan_record;}
(* and initialize it with a MOVELEFT(chan_pointer,chan_data,2);  *)

function [6]get_card_data: integer_pt;

(*$U [6,53]trigspec.ifc *)
Uses Trig_Spec;
(*$U state.ifc *)
Uses State_table;

IMPLEMENTATION (*$U trigspec.ifc *)
  USES TRIG_SPEC;
unit trig_spec,6;

uses DAS_runtime;
uses chan_spec;
(*$P *)
uses trigsel;
uses numonic1;
uses numonic3;
uses start;
(*$P+*)
(*$TTrig_Spec -- Interface data structures*)

const trig_unit = 6;

(*Trigger modes *)
  M_32_only = 0;        M_32_and_8  = 1;   M_32_arms_8 = 2;
  M_8_only  = 3;        M_4_only    = 4;   M_32_arms_4 = 5;
  M_24_only = 6;        M_24_arms_8 = 7;   M_24_arms_4 = 8;

(*Trigger clock modes*)
  Internal = 0;          Xternal_rising = 1;
  Xternal_falling = 2;   Split = 3;

(*Split clock modes*)
  Clk1 = 0;  Clk2 = 1;  Clk3 = 2;

(*Split clock edges*)
  Rising = 0;  Falling = 1;

No = 0;  Yes = 1;  Maybe = 2;

type
  trigger_words = packed array[0..max_channel] of byte;

one_per_board = packed array[0..maxslot] of byte;

one_per_type = packed array[0(*c_none*)..6(*c_new2*)] of byte;

trig_record = record
                  mode: byte,                   (* trig_modes      *)
                  clk_mode: one_per_type,       (* trig_clk_modes  *)
                  times: one_per_type;          (* interal clk rate*)
                  delay:packed array[0..6] of integer;
                  split_clocks: one_per_board;  (* split_clk_modes *)
                  split_edges: one_per_board;   (* clk_edges       *)
                  A_counter: integer;           (* trigger occur   *)
                  any_qualifiers_on: boolean;
                  ID91A32_wrd2_mode: integer;   (* 91A32 mode      *)
                  qualifiers: packed array[0..31] of byte;
                                                (* 2/91A32 1/91A08 *)
                  or_mode: boolean;             (* sez A or B mode *)
                  pos_ptr: integer_pt;          (* trigger pos data struc *)
```

```
                ID91A32_reset_mode: integer;
                board_index: one_per_board;
                trig_words: trigger_words;     (* trigger word       *)
                glt_mode: byte;                (* 1 = glitch on      *)
                high_res: byte;                (* 91A04 high res     *)
                ok_4_hi_res: boolean;          (* sez if hi res is ok *)
                deskew_91A04: boolean;         (* sez if deskew has happened*)
                clock_rates: one_per_type;     (* internal rates     *)
                thrs_hold: integer;            (* type of thrshold for 91A32 *)
                all_dont_care: boolean;        (* true if trig=all 'X' *)
                future: array[0..7] of byte;   (* plan for future needs *)
              end;
(*$P+*)
(*$U [6,53]statetab.ifc *)
uses state_table;
(*$P+*)

(*$V 13 *)

procedure prg_thrs_type(var fields: integer);
procedure prg_thrs_value;
procedure clock_redisplay(y: byte; which_clk: byte; var fields: integer);
procedure set_clk(var fields: integer);
procedure thrs_check(var dir: keys; clk: c_types; var fields: integer);
procedure fix_trig_word(var old_index,old_num_of_channels: one_per_group);
procedure set_delay(var dir: keys);
procedure trig_pos_display(y: line; which_trig_pos: ctypes; fieldnum: byte;
                           var fields: integer);
procedure set_pos(var dir: keys; field_num: byte; var fields: integer);

procedure thrs_display(x,y: byte; pod: byte; offset: byte);
procedure set_thrs_val(var direct: keys);
function  set_thrs(var direct: keys): boolean;
procedure set_chan_data(ptr: integer_pt);
procedure prg_wrd(which_word: integer);
procedure display_group(x,y: byte; id_type: ctypes);

implementation (*$U pgstart.ifc *)
   USES PG_START;
unit pg_start,51;

uses dasruntime;

uses sony_pat_gen;

uses chan_spec;

uses trig_spec;

uses trig_sel;

uses start;

type
  pg_record = record
    alt_num,ex_num: integer;   (* alt_num is used for call rmt *)
    reg_cnt10: byte;           (* copy of s32_io_D_reg *)
    time_num: integer;         (* time_num is used for out rep instruction *)
    total_strobes: integer;    (* copy of clock_gate *)
    strobe_shape: packed array[0..9] of byte;
    width,delay,strobe_value: array[0..9] of byte;
    interrupt_enable: boolean;
    edge_num: integer;
    pause_polarity,inhibit_polarity: integer;
    pods: array[1..5] of array[1..4] of integer; (* each pod *)
    total_pairs: integer;
    need_to_load_strobes: boolean;
          (* Set to true on soft-init and *)
          (* when the strobes are changed *)
          (* Set to false when they are   *)
          (* loaded.                      *)
```

```
    end; (* record *)

implementation type
  n_ch_group = 1..24;

procedure save_clock;
procedure res_clock;

procedure sen_list( y: line );
procedure ref_ch_select;
procedure ch_ns_file( att: attribute );
procedure clock_file( x: column; y: line;
                      cur_data: n_ch_group; timing_ok: boolean );
procedure setup_handle_menu;

implementation

CONST

SET_TMG_START =         26;             (* probes *)
    SETUP_START =           27;
    SETUP5_START =          32;
    SETUP7_START =          34;
    SETUP10_START =         37;
    SETUP11_START =         38;
    TH_LEV_START =          34;
    LOG_START =             41;
    AND_START =             49;

THRE_LINE =             3;

CLOCK_START =           20;             (* timing *)
    CL_TH_START =           37;
    CL_VL_START =           44;

CLOCK_LINE =            3;

FN_MODE =               0;              (* FIELD NUMBER *)
    FN_THRE =               1;
    FN_VOLT =               2;
    FN_IRQ =                3;
    FN_EXT =                4;
    FN_PAUSE =              5;

FN_INH =                6;
    FN_EXT_ST =             7;
    FN_IF_CALL =            8;
    FN_QUAL =               9;
    FN_CALL =               10;
    FN_LOGIC =              11;
    FN_SUB_INH =            12;

FN_CLOCK =              13;
    FN_REF_POD =            14;
    FN_REF_CHAN =           15;
    FN_POD =                16;
    FN_NS_CLOCK =           17;

(* probe *)
    IF_CALL_START    = 40;
    CALL_LBL_START   = 61;
    QUAL_START =       11;
```

```
    Y_PAUSE =          11;
    Y_INH_ON =         13;
    Y_EXT_START =      18;
    Y_IRQ =             6;
    Y_QUAL =            7;
    Y_EXT_JUMP =        9;

Y32_PAUSE =         6;
    Y32_INH_ON =        8;
    Y32_EXT_START =    10;

TTL_NUM =           0;
    VAR_NUM =           1;
    ECL_NUM =           2;
    CALL_NUM =          1;

MOS_STATUS =    16#02;

(* timing *)
    REF_POD_START =    21;
    REF_CH_START =     30;
    POD_START =        11,
    POD_CL_START =     19;
    CH_NS_START =      44,
    TMG_START =        56;

REF_LINE =         10;
    CHAN_LINE =        14;

type
    ch_list_num    = 0..8;
    non_prog_flags = packed array[ 0..31 ] of boolean;
    rate_type      = packed array[ 0..0 ] of byte;
    rate_pt        = ^rate_type;

var
    pg_data:      ^s16_s32_record;
    str_data:     ^pg_record;
    trig_data:    ^trig_record;
    chan_data:    ^chan_record;

rate:         rate_pt;

function probe_screen:     integer; external;
function probe32_screen:   integer; external;
function timing_screen:    integer; external;
function probe_field:      integer; external;
function probe32_field:    integer; external;
function timing_field:     integer; external;

function mode_setup_list: integer; external;

(* setup *)
function th_level_list:   integer; external;   (* threshold for 91s16 *)
function th32_lvl_list:   integer; external;   (* threshold for 91s32 *)
function irq_list:        integer; external;   (* irq *)
function pause_list:      integer; external;   (* pause *)
function ext_st_list:     integer; external;   (* external start *)
function ext_jump_list:   integer; external;   (* ext jump *)
function inh_on_list:     integer; external;   (* inhibit *)
function inh_lgc_list:    integer; external;   (* logical for inhibit *)
function inh_ext_list:    integer; external;   (* external for inhibit *)
function inh_int_list:    integer; external;   (* internal for inhibit *)
function if_call_list:    integer; external;   (* if call *)

(* timing *)
function  channel_list:   integer; external;
function  ref_chan_list:  integer; external;
function  pod_cl_list:    integer; external;

function  clk_values:     rate_pt; external;
function  selclk1:        integer; external;
```

```
function  times:                  integer; external;
procedure get_non_prg_flags( ptr: integer_pt ); external;

(*$I SAVECLOCK.PAS *)
(*$T Save_clock *)
(*****************************************************************************)
(**   NAME     : save_clock                                                 **)
(**   FUNCTION : save clock data.                                           **)
(**   CALLED BY: jp_save_clock                                              **)
(**   CALLS    : ord                                                        **)
(*****************************************************************************)

procedure save_clock;

begin (* save_clock *)
  (* save clock data *)
  with pg_data^ do
    begin
      my_clk_mode    := trig_data^.clk_mode[ ord( C_91W16 ) ];
      my_times       := trig_data^.times[ ord( C_91W16 ) ];
      my_clock_rate  := trig_data^.clock_rate[ ord( C_91W16 ) ];
      my_thrs_hold   := trig_data^.thrs_hold;
      if ( s32_only_ok ) then
        begin
          my_level := chan_data^.chan_threshold[ brd_91TO1 ].level;
          my_dac_value := chan_data^.chan_threshold[ brd_91TO1 ].DAC_value;
        end
      else
        my_dac_value := chan_data^.chan_threshold[ pg_slot[0] ].DAC_value;
    end; (* with *)
end; (* save_clock *)

(*$T Res_clock *)
(*****************************************************************************)
(**   NAME     : res_clock                                                  **)
(**   FUNCTION : restore clock data.                                        **)
(**   CALLED BY: sub_rep_res                                                **)
(**   CALLS    : ord                                                        **)
(*****************************************************************************)

procedure res_clock;

begin (* res_clock *)
  with pg_data^ do
    begin
      with trig_data^ do
        begin
          clk_mode[ ord( C_91W16 ) ] := my_clk_mode;
          times[ ord( C_91W16 ) ] := my_times;
          clock_rate[ ord( C_91W16 ) ] := my_clock_rate;
        end;

if( s32_only_ok ) then
        begin
          trig_data^.thrs_hold := my_thrs_hold;
          chan_data^.chan_threshold[ brd_91TO1 ].level := my_level;
          chan_data^.chan_threshold[ brd_91TO1 ].dac_value := my_dac_value;
        end
      else
        begin
          chan_data^.chan_threshold[ pg_slot[ 0 ] ].level := 1;
          chan_data^.chan_threshold[ pg_slot[ 0 ] ].DAC_value := my_dac_value;
        end;
    end;
end; (* res_clock *)
```

```
(*$T Delay_entry *)
procedure delay_entry( del_num: byte; cur_num: CH_GR_NUM; num: ch_list_num );

(*****************************************************************************)
(**   NAME     : delay_entry                                                **)
(**   FUNCTION : enter Delay ns for P6464 on SETUP/TIMING menu              **)
(**   CALLED BY: ns_set_file                                                **)
(**   CALLS    : shift, int_ptr                                             **)
(*****************************************************************************)

type
  data_box = packed array [ 0..3 ] of bits_4;
  data_ptr = record
    case boolean of
      true:  ( p: ^data_box );
      false: ( ip: ^integer );
    end;

var
  ns_ptr:    data_ptr;
  slot, pod: byte;
  erase_num: byte;
  i:         byte;

begin (* delay_entry *)
  slot := ( cur_num - 1 ) div 4;
  pod  := 3 - ( cur_num - 1 ) mod 4;
  if ( slot = 0 ) and ( not pg_data^.s32_only_ok ) then
    pod := pod - 2;

erase_num := 16#FF - shift( 1, - pod );

with pg_data^.probe_data[ slot ] do
    begin
      ns_ptr.ip := intptr( delay_array[ num ] );
      for i := 0 to 3 do
        ns_ptr.p^[ i ] := ( ns_ptr.p^[ i ] and erase_num ) or
                         ( shift( ( shift( del_num, i ) and 1 ), - pod ) );
    end; (* with pg_data^.probe_data *)
end; (* delay_entry *)
procedure set32_probe( bit_num: byte );

(*****************************************************************************)
(**   NAME     : set32_probe                                                **)
(**   FUNCTION : Set the S32_IO_D_REG variable for starting up 91S32 when   **)
(**              change the value on PAUSE field or EXTERNAL START field.   **)
(**                    S32_IO_D_REG                                         **)
(**                           0:  ( S16INHC )                               **)
(**                           1:  ( Inhibit output POL )                    **)
(**                           2:  Pause                                     **)
(**                           3:  ( DASINHC )                               **)
(**                           4:  Trigger mask                              **)
(**                           5:  91A08  CLK control                        **)
(**                           6:  91A32  CLK control                        **)
(**                           7:  PG EXT CLK control                        **)
(**                                                                         **)
(**   CALLED BY: sub_handle                                                 **)
(**   CALLS    : None                                                       **)
(*****************************************************************************)

var
  erase_num: byte;
  input_num: byte;

begin (* set32_probe *)
  with pg_data^ do
    begin
      input_num := 0;

if bit_num = 2 then                    (* PAUSE : ON/OFF *)
        begin
          erase_num := 16#FB;
```

```
               if str_data^.pause_polarity = 2 then
                  input_num := 4;
            end
         else if bit_num = 4 then          (* EXTERNAL START : ON/OFF *)
            begin
               erase_num := 16#EF;
               if str_data^.edge_num = 2 then
                  input_num := 16#10;
            end;

S32_IO_D_reg := ( S32_IO_D_reg and erase_num ) or input_num;
      end; (* with pg_data^ *)
end; (* set32_probe *)
(*$T Inh32_entry *)
procedure inh32_entry;

(***************************************************************************)
(** NAME     : inh32_entry                                                **)
(** FUNCTION : Set the S32_IO_D_REG variable for starting up 91S32 when   **)
(**            change the INHIBIT fields.                                 **)
(**                    S32_IO_D_REG                                       **)
(**                       0: S16INHC                                      **)
(**                       1: Inhibit output POL                           **)
(**                       2: ( Pause )                                    **)
(**                       3: DASINHC                                      **)
(**                       4: ( Trigger mask )                             **)
(**                       5: ( 91A08  CLK control )                       **)
(**                       6: ( 91A32  CLK control )                       **)
(**                       7: ( PG EXT CLK control )                       **)
(**                                                                       **)
(**             MEMORY  DAS  OUT  S16  CLOCK  INHIBIT                     **)
(**               POL   INHC POL  INHC GATE   POLARITY                    **)
(**                0     X    1    X    0       0    : DASABLED           **)
(**                1     1    0    1   16#80    X    : INT 0 ONLY         **)
(**                0     1    0    1   16#80    X    : INT 1 ONLY         **)
(**                X     0    0    1    0       1    : EXT 0 ONLY         **)
(**                X     0    0    1    0       0    : EXT 1 ONLY         **)
(**                1     0    0    1   16#80    1    : INT 0 OR EXT 0     **)
(**                1     0    0    1   16#80    0    : INT 0 OR EXT 1     **)
(**                0     0    0    1   16#80    1    : INT 1 OR EXT 0     **)
(**                0     0    0    1   16#80    0    : INT 1 OR EXT 1     **)
(**                0     0    1    1   16#80    0    : INT 0 AND EXT 0    **)
(**                0     0    1    1   16#80    1    : INT 0 AND EXT 1    **)
(**                1     0    1    1   16#80    0    : INT 1 AND EXT 0    **)
(**                1     0    1    1   16#80    1    : INT 1 AND EXT 1    **)
(**                      ^         ^                                      **)
(**                      :         :                                      **)
(**                      +---------+         (S16)                        **)
(**                          S16                                          **)
(**                                                                       **)
(** CALLED BY: sub_handle                                                 **)
(** CALLS    : None                                                       **)
(***************************************************************************)

var
   erase_num: byte;
   input_num: byte;
   sub_inh:   byte;

begin (* inh32_entry *)
   with pg_data^ do
      begin
         sub_inh := f_inh;
         erase_num := 2#11110100;
         input_num := 0;
         clock_gate := 16#80;
         str_data^.inhibit_polarity := 1;

if sub_inh = 0 then
      begin                              (* DISABLED *)
         clock_gate := 0;
         input_num := 2#00000010;
         str_data^.inhibit_polarity := 0;
```

```
                end
            else if f_sub_inh[ sub_inh ].f_logical = 0 then
              begin                              (* ONLY *)
                if ( sub_inh in [ 1..2 ] ) then
                  begin
                    input_num := 2#00000001;
                    clock_gate := 0;
                    if sub_inh = 2 then
                      str_data^.inhibit_polarity := 0;
                  end
                else
                  input_num := 2#00001001;
              end
            else if f_sub_inh[ sub_inh ].f_logical = 1 then
              begin                              (* AND *)
                input_num := 2#00000011;
                if ( sub_inh = 1 ) or
                   ( ( f_sub_inh[ sub_inh ].f_sub = 0 ) and
                     ( sub_inh in [ 3..4 ] ) ) then
                  str_data^.inhibit_polarity := 0;
              end
            else
              begin                              (* OR *)
                input_num := 2#00000001;
                if ( sub_inh = 2 ) or
                   ( ( f_sub_inh[ sub_inh ].f_sub = 1 ) and
                     ( sub_inh in [ 3..4 ] ) ) then
                  str_data^.inhibit_polarity := 0;
              end;

S32_IO_D_REG := ( S32_IO_D_REG and erase_num ) or input_num;
            str_data^.reg_cnt10 := S32_IO_D_REG;
            str_data^.Total_strobes := clock_gate;

end; (* with pg_data *)
  end; (* inh32_entry *)
  procedure data32_entry( cur_group: byte );

(***********************************************************************)
(** NAME       : data32_entry                                          **)
(** FUNCTION : Set the S32_IO_C_REG and S32_IO_B_REG for starting up 91s32 **)
(**            when change the value on POD CLOCK field.               **)
(**            ( POD CLOCK: SETUP/TIMING menu and CONFIGURATION menu ) **)
(**              S32_IO_C_REG ( Delay value C )            +   -       **)
(**                7: ( ICIC )                  3. Probe D  (1 1 0)    **)
(**                6: ( SYS ck OFF/ON )         2: Probe D  (1 0 1)    **)
(**                5: ( Stop pg line )          1: Probe D  (0 1 1)    **)
(**                4: ( Card select )           0: Probe C  (1 1 0)    **)
(**              S32_IO_B_REG ( Delay value B )            +   -       **)
(**                7: Probe C   (1 0 1)         3: Probe B  (0 1 1)    **)
(**                6: Probe C   (0 1 1)         2: Probe A  (1 1 0)    **)
(**                5: Probe B   (1 1 0)         1: Probe A  (1 0 1)    **)
(**                4: Probe B   (1 0 1)         0: Probe A  (0 1 1)    **)
(** CALLED BY: clock_file                                              **)
(** CALLS     : NONE                                                   **)
(***********************************************************************)

var
  input_num, input1_num: integer;
  erase_num, erase1_num: integer;
  num, num1, wid_data, i: integer;

begin (* data32_entry *)
  with pg_data^ do
    begin
      num := cur_group - 1;
      num1 := ( num div 4 );
      wid_data := ch_groups[ cur_group ].clock_wid;

case ( num mod 4 ) of
        0: begin                                       (* POD D *)
             erase_num := 2#11110001;
```

```
                    case wid_data of
                       0:         input_num := 2#00000110;   (* -5nS *)
                       1:         input_num := 2#00001010;   (*  OnS *)
                       2:         input_num := 2#00001100;   (* +5nS *)
                    end; (* case *)
                    S32_IO_C_reg[ num1 ] :=
                              ( S32_IO_C_reg[ num1 ] and erase_num ) or input_num;
                 end; (* case 0 *)
              1: begin                                       (* POD C *)
                    erase_num  := 2#11111110;
                    erase1_num := 2#00111111;
                    case wid_data of
                       0:         begin                      (* -5nS *)
                                    input_num  := 2#00000000;
                                    input1_num := 2#11000000;
                                  end;
                       1:         begin                      (*  OnS *)
                                    input_num  := 2#00000001;
                                    input1_num := 2#01000000;
                                  end;
                       2:         begin                      (* +5nS *)
                                    input_num  := 2#00000001;
                                    input1_num := 2#10000000;
                                  end;
                    end; (* case *)
                    S32_IO_C_reg[ num1 ] :=
                              ( S32_IO_C_reg[ num1 ] and erase_num ) or input_num;
                    S32_IO_B_reg[ num1 ] :=
                              ( S32_IO_B_reg[ num1 ] and erase1_num ) or input1_num;
                 end; (* case 1 *)
              2: begin                                       (* POD B *)
                    erase_num := 2#11000111;
                    case wid_data of
                       0:         input_num := 2#00011000;   (* -5nS *)
                       1:         input_num := 2#00101000;   (*  OnS *)
                       2:         input_num := 2#00110000;   (* +5nS *)
                    end; (* case *)
                    S32_IO_B_reg[ num1 ] :=
                              ( S32_IO_B_reg[ num1 ] and erase_num ) or input_num;
                 end; (* case 2 *)
              3: begin                                       (* POD A *)
                    erase_num := 2#11111000;
                    case wid_data of
                       0:         input_num := 2#00000011;   (* -5nS *)
                       1:         input_num := 2#00000101;   (*  OnS *)
                       2:         input_num := 2#00000110;   (* +5nS *)
                    end; (* case *)
                    S32_IO_B_reg[ num1 ] :=
                              ( S32_IO_B_reg[ num1 ] and erase_num ) or input_num;
                 end; (* case 3 *)
           end; (* case (num mod 4) *)
        end; (* with pg_data^ *)
   end; (* data32_entry *)
procedure sen_list(* y: line *);

(*****************************************************************************)
(** NAME       : sen_list                                                   **)
(** FUNCTION   : Drow one line on the CRT.                                  **)
(** CALLED BY  : disp_probes( SEUTP/PROBE ), disp_timing( SETUP/TIMING ),   **)
(**              disp_screen( CONFIGURATION )                               **)
(** CALLS      : NONE                                                       **)
(*****************************************************************************)

var
   colm: column;

begin (* sen_list *)
   for colm := 1 to 78 do screen[y, colm] := '-';
end; (* sen_list *)

(*$I TIMING.PAS *)
```

```
(*$T Timing_line *)
procedure timing_line( y: line; step_num: integer; timing_up_ok: boolean );

(***************************************************************************)
(** NAME     : timing_line                                                **)
(** FUNCTION : Draw one timing line on SETUP/TIMING menu.                 **)
(** CALLED BY: cmp_channel, ch_ns_file, ns_set_file, ref_ch_select        **)
(** CALLS    : int_ptr, fillchar, highlight                               **)
(***************************************************************************)

type
  screen_line = packed array [ 0..79 ] of char;
  screen_ptr = record
    case boolean of
      true:  ( p:  ^screen_line );
      false: ( ip: ^integer );
    end;

var
  scr_ptr:     screen_ptr;
  timing_pos:  column;
  ch1, ch2, ch3: char;

begin (* timing_line *)
  scr_ptr.ip := intptr( screen[ y ] );
  timing_pos := TMG_START + step_num;
  if timing_up_ok then
    begin
      ch_1 := "@";
      ch_2 := "A";
      ch_3 := "I";
    end
  else
    begin
      ch_1 := "I";
      ch_2 := "H";
      ch_3 := "@";
    end;

fillchar( scr_ptr.p^[ TMG_START ], step_num, ch_1 );
  scr_ptr.p^[ timing_pos ] := ch_2;
  fillchar( scr_ptr.p^[ timing_pos + 1 ], 20 - step_num, ch_3 );
  highlight( intptr( scr_ptr.p^[ TMG_START + pg_data^.f_ref_ns ] ), 1 );
end; (* timing_line *)

(*$T Ref_ch_select *)
procedure ref_ch_select;

(***************************************************************************)
(** NAME     : ref_ch_select                                              **)
(** FUNCTION : If ref_channel is clock, set f_ref_ns flag on SETUP/TIMING.**)
(** CALLED BY: setup_handle_menu, disp_timing, pod_file, cmp_channel      **)
(** CALLS    : zero, select_out, channel_list, timing_line                **)
(***************************************************************************)

var
  tim_up: boolean;

begin (* ref_ch_select *)
  with pg_data^ do
    with ch_groups[ ref_cur_num ] do
      begin
        if f_ref_channel <> 9 then
          begin
            f_ref_ns := f_chan_ns[ f_ref_channel ] + clock_wid * 5;
            tim_up := TRUE;
          end
        else
          begin
            f_ref_ns := clock_wid * 5 + 5;
            if zero( f_cl_pol ) then
              tim_up := TRUE
            else
```

```
                  tim_up := FALSE;
              end; (* else *)
           select_out( CH_NS_START, REF_LINE, channel_list, f_ref_ns, ATT_GREEN );
           timing_line( REF_LINE, f_ref_ns, tim_up );
        end; (* with *)
end; (* ref_ch_select *)
procedure cmp_channel;

(********************************************************************************)
(** NAME      : cmp_channel                                                   **)
(** FUNCTION  : Compare the channel with reference's it on SETUP/TIMING.      **)
(** CALLED BY : ns_set_file, clock_file                                       **)
(** CALLS     : timing_line, ref_ch_select                                    **)
(********************************************************************************)

var
   num: ch_list_num;

begin (* cmp_channel *)
   with pg_data^ do
      begin
        if ref_cur_num = cur_num then
           ref_ch_select;
        for num := 0 to 8 do
           with ch_groups[ cur_num ] do
              timing_line( num + CHAN_LINE,
                           f_chan_ns[ num ] + clock_wid * 5, TRUE );
     end; (* wiht pg_data^ *)
end; (* cmp_channel *)

(*$T Ns_set_file *)
procedure ns_set_file( y: line; num: ch_list_num );

(********************************************************************************)
(** NAME      : ns_set_file                                                   **)
(** FUNCTION  : Select the channel_ns field on SETUP/TIMING menu.             **)
(** CALLED BY : setup_handle_menu                                             **)
(** CALLS     : incr_decr_in, pg_stop_check, delay_entry, select_out,         **)
(**             channel_list, timing_line, cmp_channel                        **)
(********************************************************************************)

var
   i:      integer;
   ns_num: byte;
   del_num: byte;

begin (* ns_set_file *)
   with pg_data^ do
      with ch_groups[ cur_num ] do
         begin
           ns_num := f_chan_ns[ num ];
           if incr_decr_in( 10, ns_num, FALSE ) then
              begin
                pg_stop_check;
                f_chan_ns[ num ] := ns_num;
                if ns_num > 5 then
                   del_num := ns_num - 6
                else
                   del_num := ns_num + 16#A;
                delay_entry( del_num, cur_num, num );

i := f_chan_ns[ num ] + clock_wid * 5;
                select_out( CH_NS_START, y, channel_list, i, STAND_ATT );
                timing_line( y, i, TRUE );
                cmp_channel;
              end;
        end; (* with *)
end; (* ns_set_file *)
```

```
procedure ch_ns_file(* ATT: attribute *);

(****************************************************************************)
(**  NAME     : ch_ns_file                                                 **)
(**  FUNCTION : Set the timing clock and draw the timing line              **)
(**             on SETUP/TIMING menu.                                      **)
(**  CALLED BY: clock_file, disp_timing, setup_handle_menu, pod_file       **)
(**  CALLS    : select_out, channel_list, timing_line                      **)
(****************************************************************************)

var
  num: ch_list_num;
  i:   integer;

begin (* ch_ns_file *)
  for num := 0 to 8 do
    begin
      with pg_data^ do
        with ch_groups[ cur_num ] do
          begin
            i := f_chan_ns[ num ] + clock_wid * 5;
            select_out( CH_NS_START, num + CHAN_LINE, channel_list, i, ATT );
            timing_line( num + CHAN_LINE, i, TRUE );
          end; (* with *)
    end; (* fir num *)
end; (* ch_ns_file *)
(*$T Clock_file *)
procedure clock_file(* x: column; y: line;
                      cur_data: n_ch_group; timing_ok: boolean *);

(****************************************************************************)
(**  NAME     : clock_file                                                 **)
(**  FUNCTION : Select the clock and change the channel (nS).              **)
(**                      timing_ok...TRUE:  SETUP/STROBE menu              **)
(**                                  FALSE: CONFIGURATION menu             **)
(**  CALLED BY: setup_handle_menu, prob_fld_in                             **)
(**  CALLS    : incr_decr_in, pg_stop_check, select_out, pod_cl_list,      **)
(**             data9_entry, data32_entry, cmp_channel, ch_ns_file         **)
(****************************************************************************)

var
  num: integer;

begin (* clock_file *)
  with pg_data^, ch_groups[ cur_data ] do
    begin
      num := clock_wid;
      if incr_decr_in( 2, num, FALSE ) then
        begin
          pg_stop_check;
          clock_wid := num;
          select_out( x, y, pod_cl_list,  num, STAND_ATT );
                      (* Set up cont_reg9( 91s16 ), s32_io_c_reg( 91s32 ) *)
                      (* and s32_io_b_reg variable for-starting up patgen. *)
          if ( not s32_only_ok ) and ( cur_data in [ 1, 2 ] ) then
            data9_entry( TRUE, cur_data )
          else
            data32_entry( cur_data );

(* If the screen is TIMING menu, compare the *)
                      (* reference pod data.                       *)
          if timing_ok then
            begin
              cmp_channel;
              ch_ns_file( STAND_ATT );
            end;
        end; (* if incr_decr_in *)
    end; (* with *)
end; (* clock_file *)
```

```
procedure disp_timing;

(*******************************************************************)
(**   NAME     : disp_timing                                      **)
(**   FUNCTION : Displays the TIMING screen.                      **)
(**   CALLED BY: setup_handle_menu                                **)
(**   CALLS    : timing_field, template, timing_screen, select_out, **)
(**              mode_setup_list, tim_clock_out, sen_list, num_out, **)
(**              ref_chan_list, pod_cl_list, chr, ref_ch_select, ch_ns_file **)
(*******************************************************************)

const
  ATT_WAVE_YELLOW = 16#85;

var
  s: string[ 12 ];
  y: line;

begin (* disp_timing *)
  pg_data^.pg_field_list := timing_field;
  template( timing_screen );
  fillchar( screen[ 1 ], 60, " " );     (* erase the message *)
  select_out( SET_TMG_START, 0,
              mode_setup_list, pg_data^.setup_num, ATT_REV_GREEN );
  sen_list( 5 );

with pg_data^ do
    begin
      num_out( REF_POD_START, REF_LINE,
               ch_groups[ ref_cur_num ].pod_type, 16, 2, ATT_REV_GREEN );
      select_out( REF_CH_START, REF_LINE,
                  ref_chan_list, f_ref_channel, ATT_REV_GREEN );

num_out( POD_START, CHAN_LINE,
               ch_groups[ cur_num ].pod_type, 16, 2, ATT_REV_YELLOW );
      select_out( POD_CL_START + 1, CHAN_LINE,
                  pod_cl_list, ch_groups[ cur_num ].clock_wid, ATT_REV_YELLOW );
      screen[ CHAN_LINE, POD_CL_START + 6 ] := chr( ATT_GREEN );
    end; (* with ch_data^ *)

(* drow the timing chart *)
  screen[ REF_LINE, TMG_START + 21 ] := chr( ATT_GREEN );
  screen[ REF_LINE, TMG_START - 1 ] := chr( ATT_WAVE_YELLOW );
  for y := CHAN_LINE to CHAN_LINE + 8 do
    begin
      screen[ y, TMG_START + 21 ] := chr( ATT_GREEN );
      screen[ y, TMG_START - 1 ] := chr( ATT_WAVE_YELLOW );
    end;

ref_ch_select;
  ch_ns_file( ATT_REV_YELLOW );
end; (* disp_timing *)

procedure setup_handle_menu;
(*******************************************************************)
(**   NAME     : handle_set_menu                                  **)
(**   FUNCTION : Main program of SETUP menu.                      **)
(**              Invoke when Press CH_GOTO key in PROGRAM menu.   **)
(**   CALLED BY: call_sub_menu                                    **)
(**   CALLS    : release, set_cursor, probe32_field, prob_field, zero, **)
(**              disp_probes, disp_timing, move_cursor, clock_choice, **)
(**              pod_file, select_in, ref_chan_list, ref_ch_select, **)
(**              ch_ns_file, clock_file, mode_setup_list, select_out, ord, **)
(**              sub_handle, ns_set_file, check_label, check_setup, irq_set, **)
(**              dispatch                                         **)
(*******************************************************************)

var
  list, mask:    integer;
  sub_flag:      integer;
  sub_fld_list:  integer;
  num:           byte;
```

```
begin (* setup_handle_menu *)
  with pg_data^ do
    begin
                                                   (* display the screen *)
      release( pg_top_heap );
      set_cursor( st_last_x + 1, st_last_y, OFF );                    (*******)
      pg_dir := CH_LEFT;
      disp_timing;

repeat
        ACTION := FALSE;
        cur_field := move_cursor( pg_dir, pg_field_list );

case cur_field of                       (* timing field *)
          FN_REF_POD:   num := pod_file( TRUE );
          FN_REF_CHAN:  begin
                          f_ref_channel := select_in( pg_dir, ref_chan_list,
                                                      INPUT );
                          if pg_dir = CH_SELECT then
                            begin
                              ref_ch_select;
                              ch_ns_file( STAND_ATT );
                            end;
                        end;
          FN_POD:       num := pod_file( TRUE );
          FN_NS_CLOCK:  clock_file( POD_CL_START + 1,
                                    CHAN_LINE, cur_num, TRUE );
        end; (* case *)

if cur_field in [ 21..29 ] then       (* timing field *)
          ns_set_file( CHAN_LINE + cur_field - 21, cur_field - 21 );

until pg_dir in ( menu_keys + [ CH_GOTO, CH_CALL ] );

st_last_x := cursor_x;
      st_last_y := cursor_y;
    end; (* with *)
end; (* setup_handle_menu *)

begin (* set_tmg_main *)
  rate := clk_values;
end. (* set_tmg_main *)

Unit PATSETUP is  2274 bytes long.

0 errors found in compilation.

Smallest available space =  1528 words

PAX ,SETUP/NOSP=SETUP
```

We claim:

1. A method for adjusting a time delay of a signal with respect to a reference event, the method comprising the steps of:
   a. displaying a graphical depiction of the time delay as currently set,
   b. modifying the displayed graphical depiction to indicate a different time delay, and
   c. adjusting the time delay of the signal to match the different time delay indicated by the displayed graphical depiction.

2. A method as in claim 1 wherein the graphical depiction is displayed on a display terminal controlled by a processing apparatus.

3. A method as in claim 2 wherein the graphical depiction is modified by an operator utilizing means to transmit an indicating signal to the processor, said processor increasing or decreasing the delay timing according to the state of the indicating signal.

4. An apparatus for adjusting a time delay of a signal with respect to a reference event, the apparatus comprising:
   a. a display terminal for displaying a graphical depiction of the time delay as currently set,
   b. means for modifying the displayed graphical depiction to indicate a different time delay, and
   c. means for adjusting the time delay of the signal to match the different time delay indicated by the displayed graphical depiction.

5. An apparatus as in claim 4 where in said modifying means comprises:
   first means adapted for transmitting a first indicating signal for incrementing said graphically displayed time delay by a selected amount each time said first indicating signal is transmitted, and
   second means adapted for transmitting a second indicating signal for decrementing said displayed time delay by said selected amount each time said second indicating signal is transmitted.

6. An apparatus as in claim 5 wherein said first means and said second means comprise keys.

7. An apparatus for generating a test signal having a state sequence which matches the state sequence of an applied reference signal but in which state changes are delayed by a selected delay time after corresponding state changes of the applied reference signal, the apparatus comprising:
   a. means to delay said test signal state changes by the selected time, said selected time being determined by applied timing data,
   b. a display terminal for displaying a graphical depiction of the state change delay time,
   c. means for modifying the displayed delay time graphical depiction to indicate a different state change delay time, and
   d. means for generating said timing data and applying it to the delaying means, the timing data being based on the modified state change delay time indicated by the modified graphical depiction thereof.

8. An apparatus as in claim 7 wherein said modifying means comprises:
   first means adapted for transmitting a first indicating signal for incrementing said displayed delay time by a selected amount each time said first indicating signal is transmitted, and
   second means adapted for transmitting a second indicating signal for decrementing said displayed delay time by said selected amount each time said second indicating signal is transmitted.

9. An apparatus as in claim 8 wherein said delaying means comprises:
   means for generating a periodic clock signal,
   a multiple-tapped delay line for receiving the clock signal, the clock signal appearing at each tap of the delay line after having been delayed by a different delay time for each tap, means to change the state of the test signal to match the state of the reference signal on occurrence of a third indicating signal, and
   means for generating the third indicating signal, said third indicating signal being derived from a selected one of the delay line taps, said selected delay line tap being selected according to said applied timing data.

* * * * *